(12) United States Patent
Wang et al.

(10) Patent No.: US 11,031,958 B2
(45) Date of Patent: Jun. 8, 2021

(54) HYBRID POLAR CODE DESIGN FOR ULTRA-RELIABLE LOW LATENCY COMMUNICATIONS (URLLC)

(71) Applicant: QUALCOMM Incorporated, San Diego, CA (US)

(72) Inventors: Ying Wang, San Diego, CA (US); Jing Jiang, San Diego, CA (US); Yang Yang, San Diego, CA (US); Gabi Sarkis, San Diego, CA (US); Joseph Binamira Soriaga, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/447,695

(22) Filed: Jun. 20, 2019

(65) Prior Publication Data

US 2019/0393986 A1    Dec. 26, 2019

Related U.S. Application Data

(60) Provisional application No. 62/689,719, filed on Jun. 25, 2018.

(51) Int. Cl.
*H03M 13/00* (2006.01)
*H04L 1/00* (2006.01)
(Continued)

(52) U.S. Cl.
CPC ... *H03M 13/6306* (2013.01); *H03M 13/6375* (2013.01); *H04L 1/0042* (2013.01);
(Continued)

(58) Field of Classification Search
CPC ... H04L 1/0068; H04L 1/0042; H04L 1/0046; H04L 1/0047; H04L 1/0057;
(Continued)

(56) References Cited

U.S. PATENT DOCUMENTS

2018/0226995 A1* 8/2018 Wu ............... H03M 13/6356
2019/0053095 A1* 2/2019 Zhang ............... H04L 1/0013
(Continued)

OTHER PUBLICATIONS

Qualcomm Incorp: "FRANK Polar Construction: Nested Extension Design of Polar Codes Based on Mutual Information", 3GPP TSG-RAN WG1 #88b, 3GPP Draft, R1-1706130 FRANK Polar Construction Nested Extension Design of Polar Codes Based on Mutual Information , 3rd Generation Partnership Project (3GPP), Mobile (Year: 2017).*

(Continued)

*Primary Examiner* — Joshua Kading
(74) *Attorney, Agent, or Firm* — Harrity & Harrity, LLP/Qualcomm

(57) ABSTRACT

Various aspects of the present disclosure generally relate to wireless communication. In some aspects, a wireless communication device may determine to block puncture or to block shorten a set of transmitted bits of an adjusted fractally enhanced kernel polar code for a communication of an incremental redundancy (IR)-hybrid automatic repeat request (HARQ) process based at least in part on a code rate associated with the communication of the IR-HARQ process. The wireless communication device may generate the adjusted fractally enhanced kernel polar code for the communication based at least in part on determining to block puncture or to block shorten the set of transmitted bits. The wireless communication device may transmit the communication using the adjusted fractally enhanced kernel polar code. Numerous other aspects are provided.

30 Claims, 14 Drawing Sheets

(51) Int. Cl.
H04L 1/18 (2006.01)
H03M 13/13 (2006.01)

(52) U.S. Cl.
CPC .......... *H04L 1/0046* (2013.01); *H04L 1/0047* (2013.01); *H04L 1/0057* (2013.01); *H04L 1/0068* (2013.01); *H04L 1/1812* (2013.01); *H03M 13/13* (2013.01); *H03M 13/618* (2013.01); *H03M 13/6362* (2013.01)

(58) Field of Classification Search
CPC ... H04L 1/1812; H04L 1/1819; H04L 1/0067; H04L 1/0643; H04L 1/1816; H04L 1/1825; H04L 1/1861; H04L 1/1893; H04L 1/0009; H04L 5/04; H03M 13/6375; H03M 13/13; H03M 13/618; H03M 13/6306; H03M 13/6362; H03M 13/05; H03M 13/251; H03M 13/155
See application file for complete search history.

(56) References Cited

U.S. PATENT DOCUMENTS

| | | | | |
|---|---|---|---|---|
| 2019/0181979 | A1* | 6/2019 | Wang | H03M 13/251 |
| 2019/0245560 | A1* | 8/2019 | Yang | H03M 13/1125 |
| 2019/0268106 | A1* | 8/2019 | Chen | H04L 1/0057 |
| 2019/0296769 | A1* | 9/2019 | Zhang | H03M 13/618 |
| 2019/0312676 | A1* | 10/2019 | Jeong | H04L 1/0013 |
| 2020/0099471 | A1* | 3/2020 | Ye | H03M 13/13 |
| 2020/0220648 | A1* | 7/2020 | Wang | H03M 13/6362 |
| 2020/0236589 | A1* | 7/2020 | Zhang | H04L 1/0057 |

OTHER PUBLICATIONS

Competence Centre, 650, Route Des, vol. RAN WG1, No. Spokane, USA, Apr. 3, 2017-Apr. 7, 2017, Mar. 30, 2017 (Mar. 30, 2017), 24 Pages, XP051252420, Retrieved from the Internet: URL: http://www.3gpp.org/ftp/tsg_ran/WG1_RL1/TSGR1_88b/Docs/ [retrieved on Mar. 30, 2017], Section 3.3, Appendices A, B. (Year: 2017).*

Huawei, et al., "Channel Coding for URLLC", 3GPP TSG RAN WG1 Meeting 91, 3GPP Draft, R1-1720759 Channel Coding for URLLC, 3rd Generation Partnership Project (3GPP), Mobile Competence Centre; 650, Route Des Lucioles; F-06921 Sophia-Antipolis Cedex; France, vol. RAN WG1, No. Reno, USA; Nov. 27, 2017-Dec. 1, 2017, Nov. 18, 2017 (Nov. 18, 2017), 16 Pages, XP051370210, Retrieved from the Internet: URL:http://www.3gpp.org/ftp/tsg%5Fran/WG1%5FRL1/TSGR1%5F91/Docs/ [retrieved on Nov. 18, 2017] Sections 2.3.2 and 3 References.

Huawei, et al., "HARQ for Polar Codes", 3GPP TSG RAN WG1 Meeting #92, 3GPP Draft; R1-1801469, 3rd Generation Partnership Project (3GPP), Mobile Competence Centre; 650, Route Des Lucioles; F-06921 Sophia-Antipolis Cedex; France, vol. RAN WG1, No. Athens, Greece; Feb. 26, 2018-Mar. 2, 2018, Feb. 17, 2018 (Feb. 17, 2018), 4 Pages, XP051397568, Retrieved from the Internet URL:http://www.3gpp.org/ftp/tsg%5Fran/WG1%5FRL1/TSGR1%5F92/Docs/ [retrieved on Feb. 17, 2018] Sections 2.1 and 2.2.

International Search Report and Written Opinion—PCT/US2019/038526—ISA/EPO—dated Sep. 20, 2019.

MA L., et al., "An Incremental Redundancy HARQ Scheme for Polar Code", Aug. 31, 2017 (Aug. 31, 2017), pp. 1-6, XP055449712, Retrieved from the Internet URL: https://arxiv.org/pdf/1708.09679.pdf [retrieved on Feb. 9, 2018] Section 3, Figures 2,3.

Qualcomm Incorporated: "Rate-Matching Scheme for Polar Codes and Performance Evaluation", 3GPP TSG-RAN WG1 #89, 3GPP Draft; R1-1708647 Rate-Matching Scheme for Polar Codes and Performance Evaluation, 3rd Generation Partnership Project (3GPP), Mobile Competence Centre; 650, Route Des Lucioles; F-6921 Sophia—A, vol. RAN WG1, No. Hangzhou; May 15, 2017-May 19, 2017, May 14, 2017, XP051273834, 9 Pages, Retrieved from the Internet URL: http://www.3gpp.org/ftp/Meetings_3GPP_SYNC/RAN1/Docs/ [retrieved on May 14, 2017] the whole document.

* cited by examiner

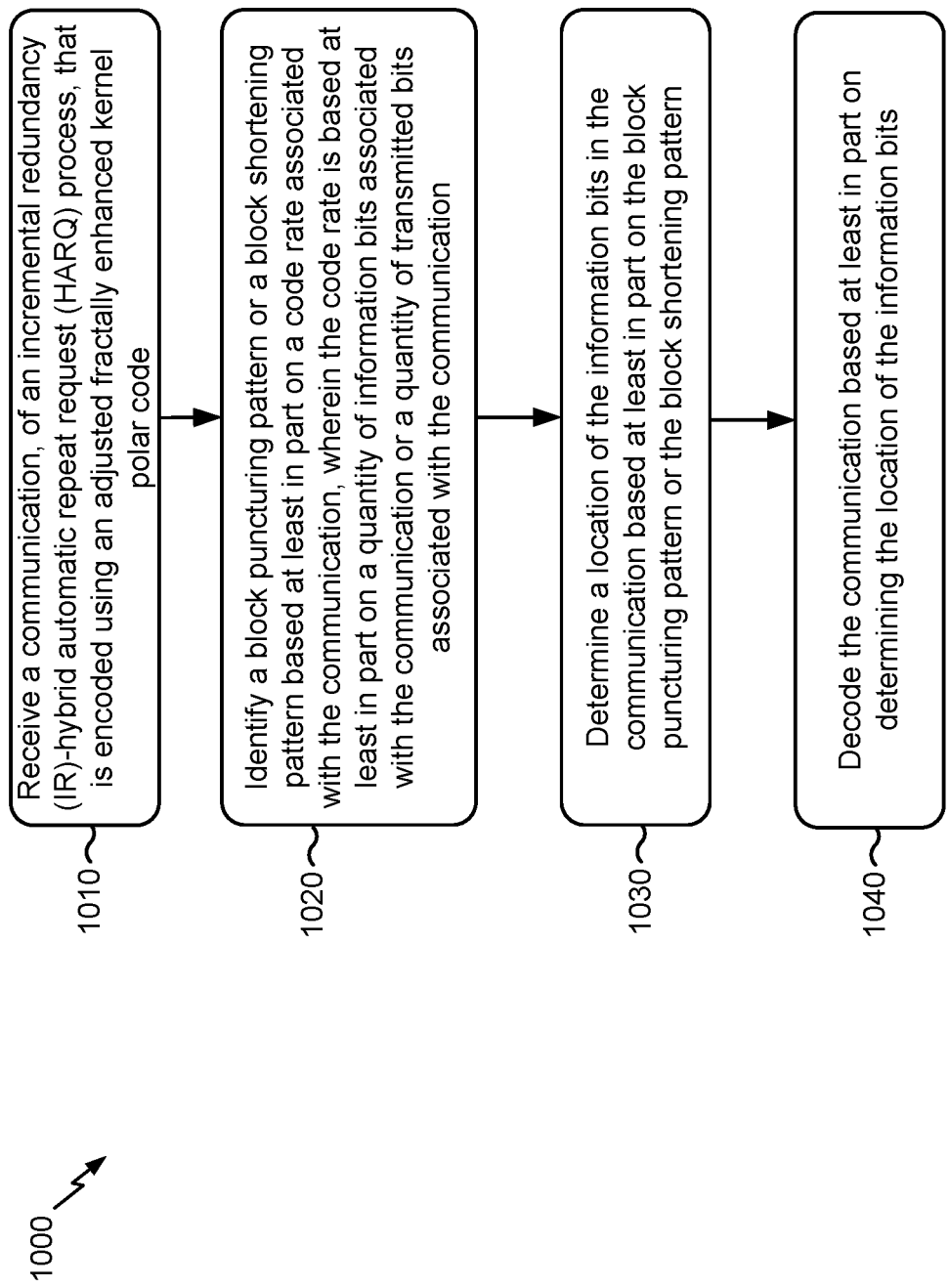

HYBRID POLAR CODE DESIGN FOR ULTRA-RELIABLE LOW LATENCY COMMUNICATIONS (URLLC)

CROSS-REFERENCE TO RELATED APPLICATIONS UNDER 35 U.S.C. § 119

This application claims priority to U.S. Provisional Patent Application No. 62/689,719, filed on Jun. 25, 2018, entitled "TECHNIQUES AND APPARATUSES FOR HYBRID POLAR CODE DESIGN FOR ULTRA-RELIABLE LOW LATENCY COMMUNICATIONS (URLLC)," which is hereby expressly incorporated by reference herein.

FIELD OF THE DISCLOSURE

Aspects of the present disclosure generally relate to wireless communication and to techniques and apparatuses for hybrid polar code design for ultra-reliable low latency communications (URLLC).

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless communication network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a New Radio (NR) BS, a 5G Node B, and/or the like.

The above multiple access technologies have been adopted in various telecommunication standards to provide a common protocol that enables different user equipment to communicate on a municipal, national, regional, and even global level. New Radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. However, as the demand for mobile broadband access continues to increase, there exists a need for further improvements in LTE and NR technologies. Preferably, these improvements should be applicable to other multiple access technologies and the telecommunication standards that employ these technologies.

SUMMARY

In some aspects, a method of wireless communication, performed by a wireless communication device, may include determining to block puncture or to block shorten a set of transmitted bits of an adjusted fractally enhanced kernel polar code for a communication of an incremental redundancy (IR)-hybrid automatic repeat request (HARQ) process based at least in part on a code rate associated with the communication of the IR-HARQ process, wherein the code rate is based at least in part on a quantity of information bits associated with the communication or a quantity of transmitted bits associated with the communication. The method may include generating the adjusted fractally enhanced kernel polar code for the communication based at least in part on determining to block puncture or to block shorten the set of transmitted bits. The method may include transmitting the communication using the adjusted fractally enhanced kernel polar code.

In some aspects, a wireless communication device for wireless communication may include memory and one or more processors operatively coupled to the memory. The memory and the one or more processors may be configured to determine to block puncture or to block shorten a set of transmitted bits of an adjusted fractally enhanced kernel polar code for a communication of an IR-HARQ process based at least in part on a code rate associated with the communication of the IR-HARQ process, wherein the code rate is based at least in part on a quantity of information bits associated with the communication or a quantity of transmitted bits associated with the communication. The memory and the one or more processors may be configured to generate the adjusted fractally enhanced kernel polar code for the communication based at least in part on determining to block puncture or to block shorten the set of transmitted bits. The memory and the one or more processors may be configured to transmit the communication using the adjusted fractally enhanced kernel polar code.

In some aspects, a non-transitory computer-readable medium may store one or more instructions for wireless communication. The one or more instructions, when executed by one or more processors of a wireless communication device, may cause the one or more processors to determine to block puncture or to block shorten a set of transmitted bits of an adjusted fractally enhanced kernel polar code for a communication of an IR-HARQ process based at least in part on a code rate associated with the communication of the IR-HARQ process, wherein the code rate is based at least in part on a quantity of information bits associated with the communication or a quantity of transmitted bits associated with the communication. The one or more instructions, when executed by one or more processors of the wireless communication device, may cause the one or more processors to generate the adjusted fractally enhanced kernel polar code for the communication based at least in part on determining to block puncture or to block shorten the set of transmitted bits. The one or more instructions, when executed by one or more processors of the wireless communication device, may cause the one or more processors to transmit the communication using the adjusted fractally enhanced kernel polar code.

In some aspects, an apparatus for wireless communication may include means for determining to block puncture or to block shorten a set of transmitted bits of an adjusted fractally enhanced kernel polar code for a communication of an IR-HARQ process based at least in part on a code rate associated with the communication of the IR-HARQ process, wherein the code rate is based at least in part on a quantity of information bits associated with the communication or a quantity of transmitted bits associated with the communication. The apparatus may include means for generating the adjusted fractally enhanced kernel polar code for the communication based at least in part on determining to block puncture or to block shorten the set of transmitted bits. The apparatus may include means for transmitting the communication using the adjusted fractally enhanced kernel polar code.

In some aspects, a method of wireless communication, performed by a wireless communication device, may include receiving a communication, of an IR-HARQ process, that is encoded using an adjusted fractally enhanced kernel polar code; identifying a block puncturing pattern or a block shortening pattern based at least in part on a code rate associated with the communication, wherein the code rate is based at least in part on a quantity of information bits associated with the communication or a quantity of transmitted bits associated with the communication; determining a location of the information bits in the communication based at least in part on the block puncturing pattern or the block shortening pattern; and decoding the communication based at least in part on determining the location of the information bits.

In some aspects, a wireless communication device for wireless communication may include memory and one or more processors operatively coupled to the memory. The memory and the one or more processors may be configured to receive a communication, of an IR-HARQ process, that is encoded using an adjusted fractally enhanced kernel polar code; identify a block puncturing pattern or a block shortening pattern based at least in part on a code rate associated with the communication, wherein the code rate is based at least in part on a quantity of information bits associated with the communication or a quantity of transmitted bits associated with the communication; determine a location of the information bits in the communication based at least in part on the block puncturing pattern or the block shortening pattern; and decode the communication based at least in part on determining the location of the information bits.

In some aspects, a non-transitory computer-readable medium may store one or more instructions for wireless communication. The one or more instructions, when executed by one or more processors of a wireless communication device, may cause the one or more processors to receive a communication, of an IR-HARQ process, that is encoded using an adjusted fractally enhanced kernel polar code; identify a block puncturing pattern or a block shortening pattern based at least in part on a code rate associated with the communication, wherein the code rate is based at least in part on a quantity of information bits associated with the communication or a quantity of transmitted bits associated with the communication; determine a location of the information bits in the communication based at least in part on the block puncturing pattern or the block shortening pattern; and decode the communication based at least in part on determining the location of the information bits.

In some aspects, an apparatus for wireless communication may include means for receiving a communication, of an IR-HARQ process, that is encoded using an adjusted fractally enhanced kernel polar code; means for identifying a block puncturing pattern or a block shortening pattern based at least in part on a code rate associated with the communication, wherein the code rate is based at least in part on a quantity of information bits associated with the communication or a quantity of transmitted bits associated with the communication; means for determining a location of the information bits in the communication based at least in part on the block puncturing pattern or the block shortening pattern; and means for decoding the communication based at least in part on determining the location of the information bits.

Aspects generally include a method, apparatus, system, computer program product, non-transitory computer-readable medium, user equipment, base station, wireless communication device, and/or processing system as substantially described herein with reference to and as illustrated by the accompanying drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

FIGS. 9 and 10 are diagrams illustrating example processes performed, for example, by a wireless communication device, in accordance with various aspects of the present disclosure.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described herein using terminology commonly associated with 3G and/or 4G wireless technologies, aspects of the present disclosure can be applied in other generation-based communication systems, such as 5G and later, including NR technologies.

Figure 1:
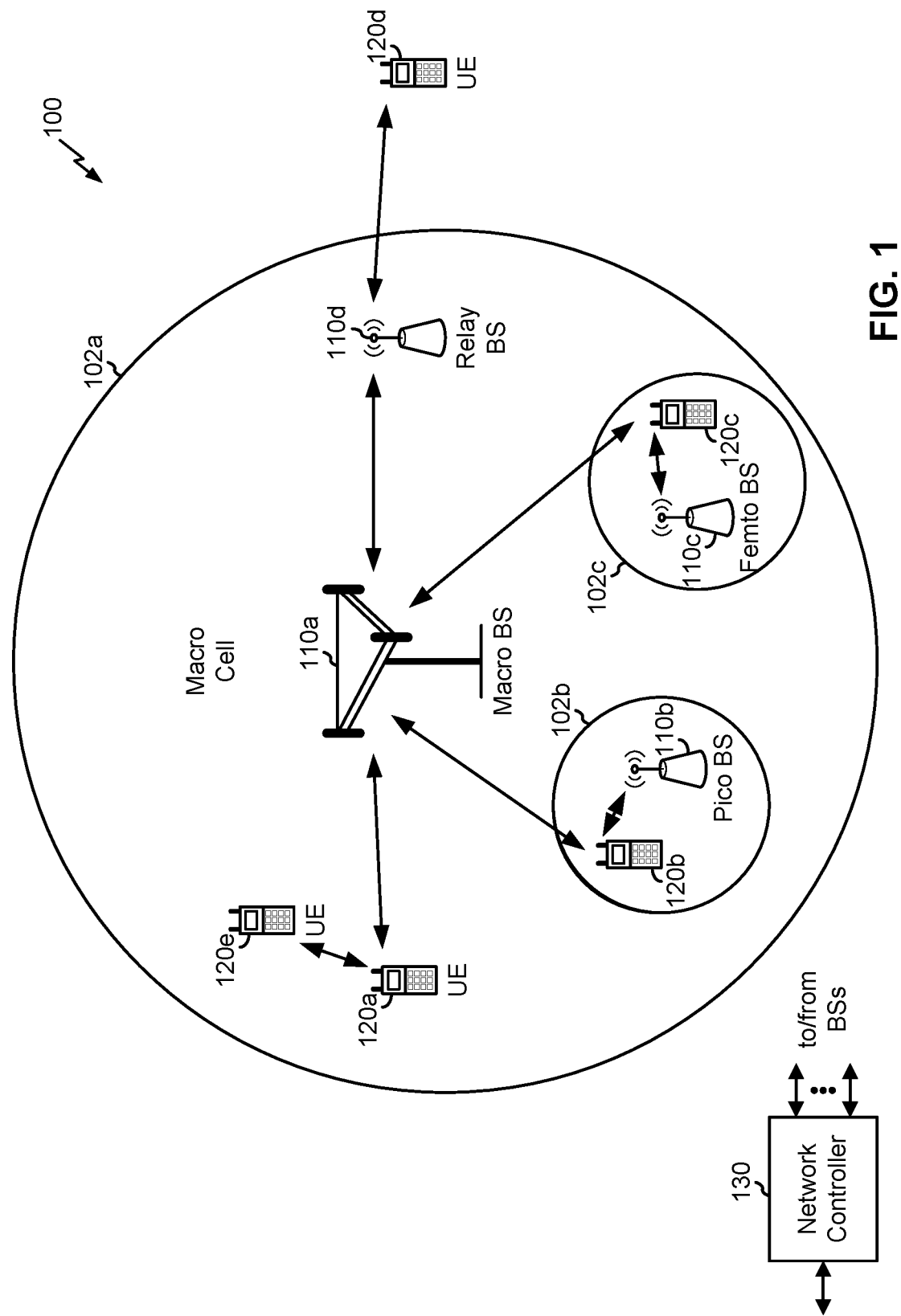
FIG. 1 is a block diagram conceptually illustrating an example of a wireless communication network, in accordance with various aspects of the present disclosure.

FIG. 1 is a diagram illustrating a network 100 in which aspects of the present disclosure may be practiced. The network 100 may be an LTE network or some other wireless network, such as a 5G or NR network. Wireless network 100 may include a number of BSs 110 (shown as BS 110a, BS 110b, BS 110c, and BS 110d) and other network entities. A BS is an entity that communicates with user equipment (UEs) and may also be referred to as a base station, a NR BS, a Node B, a gNB, a 5G node B (NB), an access point, a transmit receive point (TRP), and/or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). A BS for a macro cell may be referred to as a macro BS. A BS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the access network 100 through various types of backhaul interfaces such as a direct physical connection, a virtual network, and/or the like using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay station 110d may communicate with macro BS 110a and a UE 120d in order to facilitate communication between BS 110a and UE 120d. A relay station may also be referred to as a relay BS, a relay base station, a relay, and/or the like.

Wireless network 100 may be a heterogeneous network that includes BSs of different types, e.g., macro BSs, pico BSs, femto BSs, relay BSs, and/or the like. These different types of BSs may have different transmit power levels, different coverage areas, and different impacts on interference in wireless network 100. For example, macro BSs may have a high transmit power level (e.g., 5 to 40 Watts) whereas pico BSs, femto BSs, and relay BSs may have lower transmit power levels (e.g., 0.1 to 2 Watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, and/or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, location tags, and/or the like, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing that houses components of UE 120, such as processor components, memory components, and/or the like.

In general, any number of wireless networks may be deployed in a given geographic area. Each wireless network may support a particular RAT and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, and/or the like), a mesh network, and/or the like. In this case, the UE 120 may perform scheduling operations, resource selection operations, and/or other operations described elsewhere herein as being performed by the base station 110.

As indicated above, FIG. 1 is provided merely as an example. Other examples may differ from what is described with regard to FIG. 1.

Figure 2:
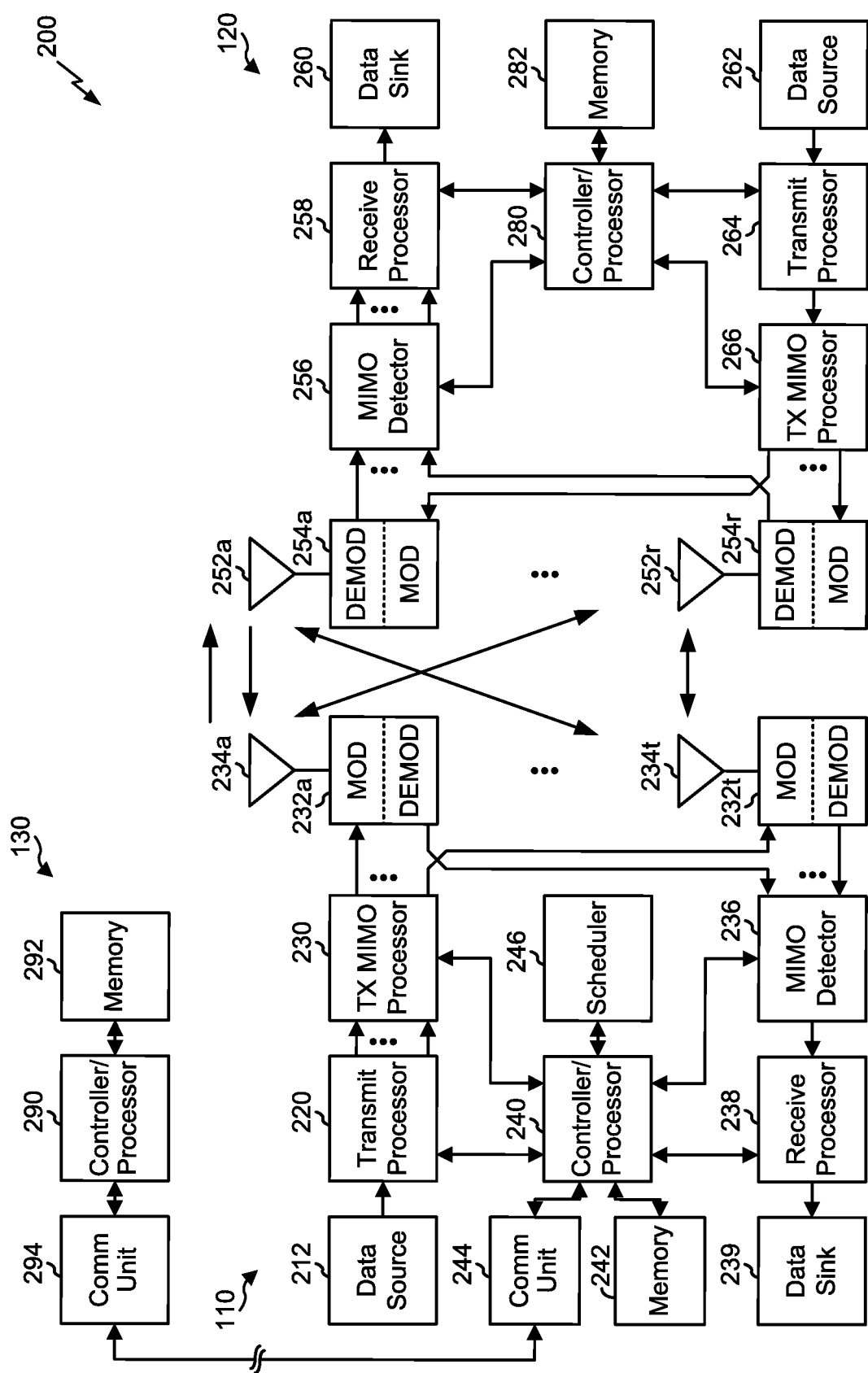
FIG. 2 is a block diagram conceptually illustrating an example of a base station in communication with a user equipment (UE) in a wireless communication network, in accordance with various aspects of the present disclosure.

FIG. 2 shows a block diagram of a design 200 of base station 110 and UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM and/or the like) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to various aspects described in more detail below, the synchronization signals can be generated with location encoding to convey additional information.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like. In some aspects, one or more components of UE 120 may be included in a housing.

On the uplink, at UE 120, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM, CP-OFDM, and/or the like), and transmitted to base station 110. At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

Controller/processor 240 of base station 110, controller/processor 280 of UE 120, and/or any other component(s) of FIG. 2 may perform one or more techniques associated with hybrid polar code design for ultra-reliable low latency communications (URLLC), in accordance with various aspects of the present disclosure as described in more detail elsewhere herein. For example, controller/processor 240 of base station 110, controller/processor 280 of UE 120, and/or any other component(s) of FIG. 2 may perform or direct operations of, for example, process 900 of FIG. 9, process 1000 of FIG. 10, and/or other processes as described herein. Memories 242 and 282 may store data and program codes for base station 110 and UE 120, respectively. A scheduler 246 may schedule UEs for data transmission on the downlink and/or uplink.

In some aspects, UE 120 and/or base station 110 may include means for determining to block puncture or to block shorten a set of transmitted bits of an adjusted fractally enhanced kernel polar code for a communication of an incremental redundancy (IR)-hybrid automatic repeat request (HARM) process based at least in part on a code rate associated with the communication of the IR-HARQ process, means for generating the adjusted fractally enhanced kernel polar code for the communication based at least in part on determining to block puncture or to block shorten the set of transmitted bits, means for transmitting the communication using the adjusted fractally enhanced kernel polar code, and/or the like. In some aspects, such means may include one or more components of UE 120 and/or base station 110 described in connection with FIG. 2.

Additionally, or alternatively, UE 120 and/or base station 110 may include means for receiving a communication, of an IR-HARQ process, that is encoded using an adjusted fractally enhanced kernel polar code; means for identifying a block puncturing pattern or a block shortening pattern based at least in part on a code rate associated with the communication, wherein the code rate is based at least in part on a quantity of information bits associated with the communication or a quantity of transmitted bits associated with the communication; means for determining a location of the information bits in the communication based at least in part on the block puncturing pattern or the block shortening pattern; means for decoding the communication based at least in part on determining the location of the information bits; and/or the like. In some aspects, such means may include one or more components of UE 120 and/or base station 110 described in connection with FIG. 2.

As indicated above, FIG. 2 is provided merely as an example. Other examples may differ from what is described with regard to FIG. 2.

Figure 3:
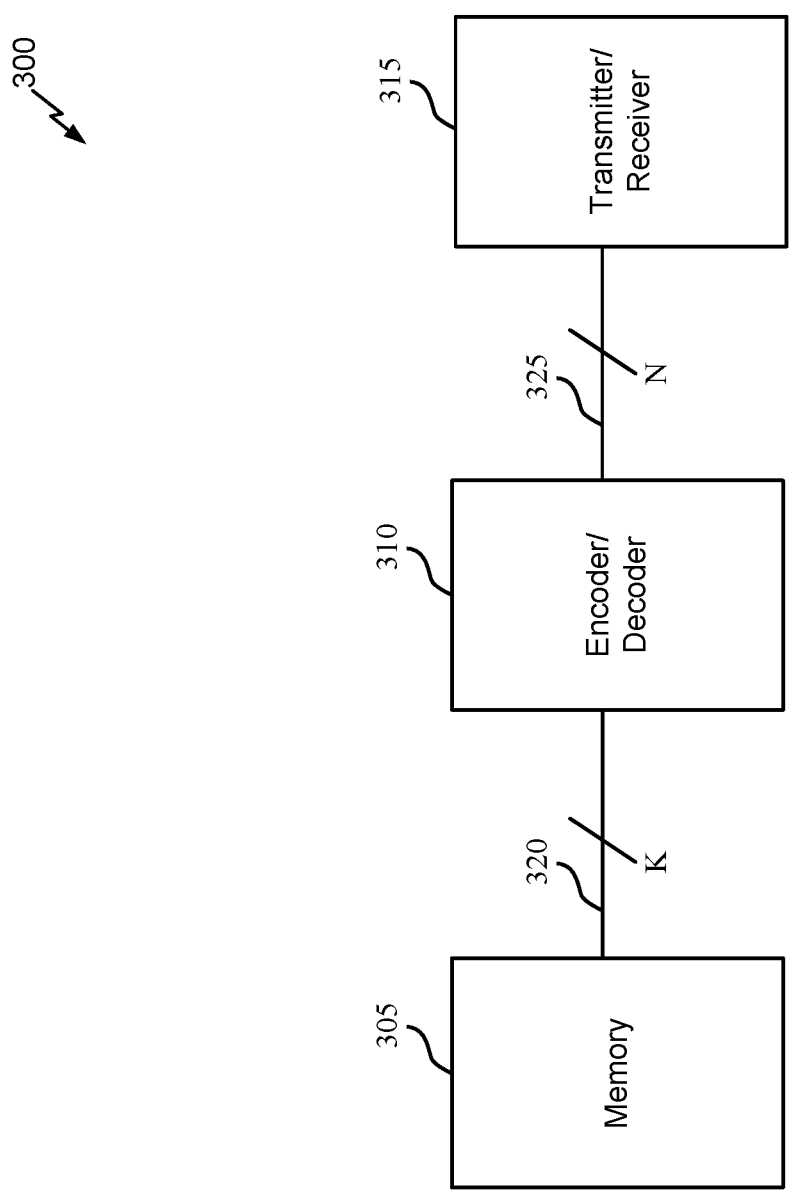
FIG. 3 illustrates an example of a device that supports adjusted fractally enhanced polar codes, in accordance with aspects of the present disclosure.

FIG. 3 illustrates an example of a device 300 that supports adjusted fractally enhanced polar codes, in accordance with aspects of the present disclosure.

The device 300 may be any device within a wireless network 100 that performs an encoding or decoding process (e.g., using an error-correcting code, such as a polar code). Device 300 may be an example of a base station 110 or a UE 120 as described with reference to FIG. 1.

As shown, device 300 includes a memory 305, an encoder/decoder 310, and a transmitter/receiver 315. First bus 320 may connect memory 305 to encoder/decoder 310 and second bus 325 may connect encoder/decoder 310 to transmitter/receiver 315. In some cases, device 300 may have data stored in memory 305 to be transmitted to another device, such as a base station 110 or a UE 120. To initiate the transmission process, device 300 may retrieve from memory 305 the data for transmission. The data may include a number of payload bits, 'A,' which may be is or 0s, provided from memory 305 to encoder/decoder 310 via first bus 320. In some cases, these payload bits may be combined with a number of parity bits, to form a total set of information bits, 'A+L.' The number of information bits may be represented as a value 'K,' as shown. The encoder/decoder 310 may implement a polar code with a block length, 'M,' for encoding the information bits, where M may be different than or the same as K. Such a polar code may be referred to as an (M, K) polar code. The bits that are not allocated as information bits (i.e., M-K bits) may be assigned as frozen bits.

In some cases, to perform a polar coding operation, the encoder 310 may need to generate a codeword of length, 'N,' where N is a power of 2 (i.e., $N=2^m$ where m is an integer value). If M is not a power of 2, the encoder 310 may round the value of M up to the nearest valid N value. For example, if M=400, the encoder 310 may determine a codeword length of N=512 (e.g., the nearest valid value for N greater than or equal to M) in order to support polar coding. In these cases, the encoder 310 may encode a codeword of length N, and then may puncture a number of bits N-M to obtain a codeword of the specified block length M for transmission.

The encoder 310 may attempt to assign the information bits to the K most reliable bit channels, and the frozen bits to the remaining bit channels. In some cases (e.g., for large values of M or N, such as N=1024), the encoder/decoder 310 may implement a fractally enhanced kernel polar code for assigning the information bits K to reliable bit channels. Fractally enhanced kernel polar coding may provide better reliability for generated codewords than some polar coding schemes (e.g., bit reversal shorten polarization-weight (PW)), and may be less complex than other polar coding schemes (e.g., DE). Additionally, implementing a fractally enhanced kernel polar code may allow the encoder 310 to flexibly adapt the coding rate when generating codewords for IR-HARQ communications. The encoder 310 may determine information bit channels based at least in part on the fractally enhanced kernel polar code, and may assign frozen bits to the remaining channels. Frozen bits may be bits of a default value (e.g., 0, 1) known to both the encoder and decoder (i.e., the encoder encoding information bits at a transmitter and the decoder decoding the codeword received at a receiver). Further, from the receiving device perspective, device 300 may receive encoded data via receiver 315, and may decode the encoded data using decoder 310 to obtain the transmitted data.

In some wireless systems, decoder 310 may be an example of a successive cancellation (SC) or a successive cancellation list (SCL) decoder. A base station 110 or a UE 120 may receive a transmission including a codeword at receiver 315, and may send the transmission to the SCL decoder (e.g., decoder 310). The SCL decoder may determine input logarithmic-likelihood ratios (LLRs) for the bit channels of the received codeword. During decoding, the SCL decoder may determine decoded LLRs based at least in part on these input LLRs, where the decoded LLRs correspond to each bit channel of the polar code. These decoded LLRs may be referred to as bit metrics. In some cases, if the LLR is zero or a positive value, the SCL decoder may determine the corresponding bit is a 0 bit, and a negative LLR may correspond to a 1 bit. The SCL decoder may use the bit metrics to determine the decoded bit values.

The SCL decoder may employ multiple concurrent SC decoding processes. Each SC decoding process may decode the codeword sequentially (e.g., in order of the bit channel indices). Due to the combination of multiple SC decoding processes, the SCL decoder may calculate multiple decoding path candidates. For example, an SCL decoder of list size 'L' (i.e., the SCL decoder has L SC decoding processes) may calculate L decoding path candidates, and a corresponding reliability metric (e.g., a path metric) for each decoding path candidate. The path metric may represent a reliability of a decoding path candidate or a probability that the corresponding decoding path candidate is the correct set of decoded bits. The path metric may be based at least in part on the determined bit metrics and the bit values selected at each bit channel. The SCL decoder may have a number of levels equal to the number of bit channels in the received codeword. At each level, each decoding path candidate may select either a 0 bit or a 1 bit based at least in part on a path metric of the 0 bit and the 1 bit. The SCL decoder may select a decoding path candidate based at least in part on the path metrics, and may output the bits corresponding to the selected decoding path as the decoded sets of bits. For example, the SCL decoder may select the decoding paths with the highest path metrics.

If an SCL decoder determines that the first quantity of bits are all frozen bits, the SCL decoder may determine that the correct decoding path for the first number of bits must be the default frozen bit values (e.g., if the default frozen bit value is 0, the correct decoding path for the first number of bits must be all zeros). Once the SCL decoder reaches the first information bit, the SCL decoder may begin performing operations to decode the rest of the bits of the codeword, as the SCL decoder may not be able to determine the correct decoding path from the first information bit onwards (e.g., because the first information bit may be a 0 or a 1). However, the SCL decoder may still determine bit metrics for the bit channels containing frozen bits, and may use these bit metrics when calculating path metrics for the decoding path candidates. For example, the SCL decoder may update the path metric for the decoding candidates after every bit, regardless of bit type (e.g., after each frozen bit, payload bit, parity bit, etc.).

In some cases, an encoder 310 and decoder 310 may implement adjusted fractally enhanced kernel polar codes. The encoder 310 may adjust the construction of the polar code using an additional number of information bits that may be removed from the selected information bit set of a first half or second half block length sequence. The adjusted fractally enhanced kernel polar coding process may mitigate or remove spikes in the achievable signal-to-noise ratio (SNR) for a codeword transmission by shifting information bits from channels of lower capacity to channels of higher capacity. The adjusted fractally enhanced kernel polar codes may have a similar complexity and memory overhead as fractally enhanced kernel polar codes. Additionally, the adjusted fractally enhanced kernel polar codes may have similar—or better, for some numbers of information bits K—achievable SNR curves than density evolution (DE) polar codes, with lower complexity and overhead.

As indicated above, FIG. 3 is provided merely as an example. Other examples may differ from what is described with regard to FIG. 3.

Figure 4:
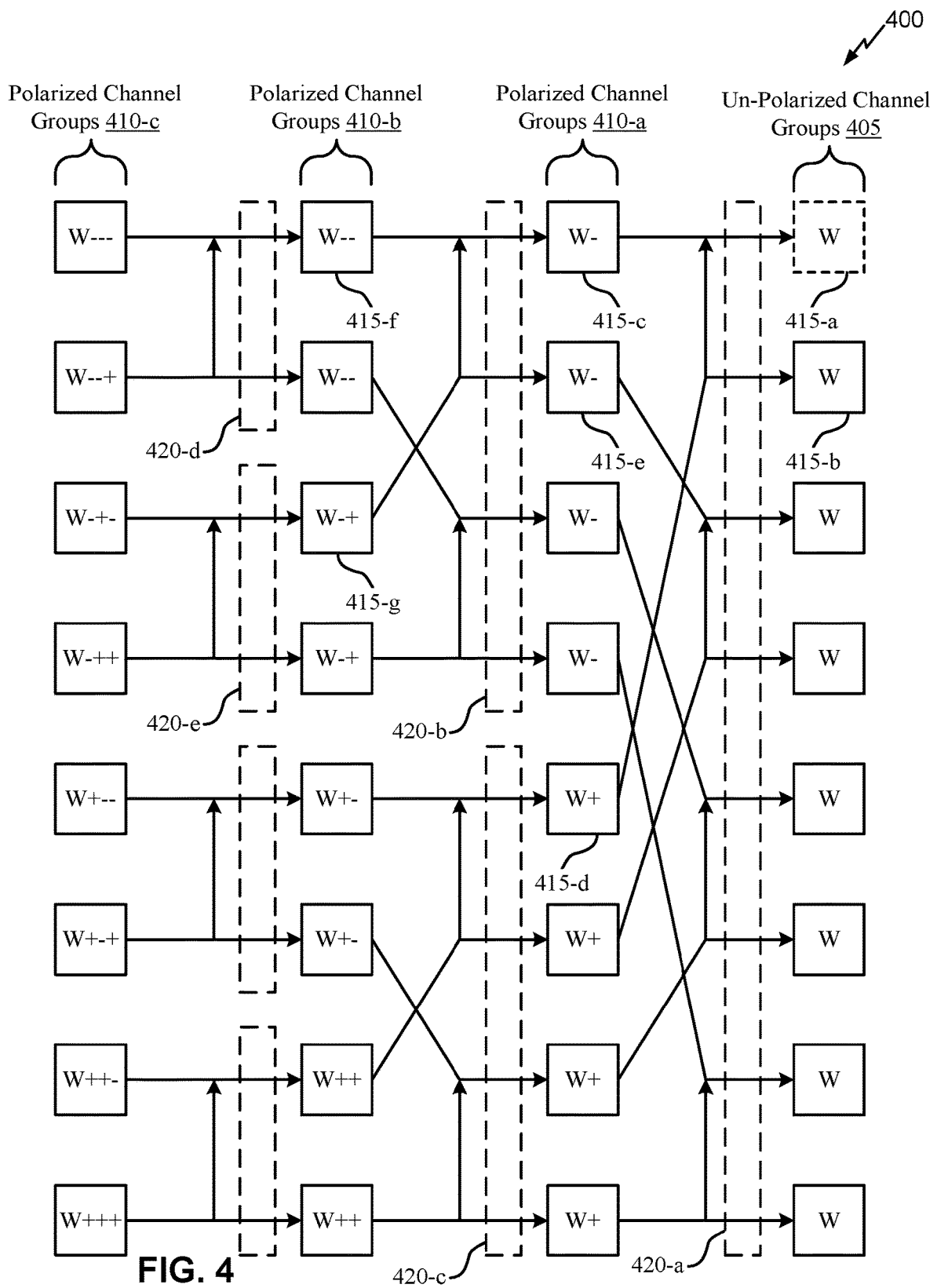
FIG. 4 illustrates an example of a fractally enhanced kernel polar code construction that supports adjusted fractally enhanced kernel polar codes, in accordance with aspects of the present disclosure.

FIG. 4 illustrates an example of a fractally enhanced kernel polar code construction that supports adjusted fractally enhanced kernel polar codes, in accordance with aspects of the present disclosure.

The fractally enhanced kernel polar code construction 400 may be performed by an encoder/decoder 310, which may be a component of a base station 110 or UE 120 as described above with reference to FIG. 1. The fractally enhanced kernel polar code construction 400 may show a visual representation of polarization and information bit channel assignments for a polar-encoded codeword. An encoder may receive an un-polarized channel group 405 as input, and may perform a series of recursive polarizations to obtain polarized channel groups 410-c.

To determine the distribution of information bits between bit channels or channel groups, an encoder may utilize mutual information. According to mutual information evolution, the rate distributions R may be mapped for un-polarized channels 415 W to rate distributions R1 and R2 for polarized channels 415 W+ and W−, respectively. In some cases, an encoder may utilize mutual information (e.g., as opposed to reliability metrics) to assign bit channels based at least in part on coding rate, R and puncturing or shortening pattern. To construct a capacity achieving polar code with SC decoding for a channel 415 W with a coding rate R=K/N, the encoder may distribute the information bits K such that polarized channels 415 W− and W+ also achieve capacity. To achieve capacity on channels 415 W− and W+, the encoder may distribute information bits according to:

$$K\_upper=R0*(N/2), K\_lower=R1*(N/2), \text{ and}$$
$$K\_upper=R0/(R0+R1)*K,$$

where K_upper is the number of information bits to include in the first half of sub-blocks, K_lower is the number of information bits to include in the second half of sub-blocks, R0 is the capacity of channel W−, and R1 is the capacity of channel W+. In some cases, K_upper may be referred to as K− and K_lower may be referred to as K+.

For the fractally enhanced kernel polar code construction 400 with greater than two channels, the encoder may recursively perform these polarizations and information bit assignment procedures. For example, as illustrated, the encoder may polarize un-polarized channels 415-a and 415-b, resulting in polarized channels 415-c and 415-d. In this case, based at least in part on the channel polarization, channel 415-d may have a greater channel capacity than channel 415-c. Accordingly, channel 415-d may be referred to as channel W+ (e.g., greater channel capacity than an un-polarized channel 415 W), and channel 415-c may be referred to as W− (e.g., lesser channel capacity than the un-polarized channel 415 W). Similarly, the encoder may polarize the other un-polarized channels 415 in the un-polarized channel group 405, resulting in polarized channel group 410-a. As each polarization process receives two channels 415 (e.g., with equal channel capacity) as input, and outputs two polarized channels (e.g., one channel with higher channel capacity than the inputs, and one channel with lower channel capacity), each stage of the recursive process may turn a group of channels into two equally sized sub-blocks 420 of polarized channels.

As illustrated, an encoder may polarize a set of eight input channels 415. These eight input channels 415 may correspond to the codeword size N for encoding. The encoder may encode a number of information bits K (e.g., four information bits) within this codeword. Accordingly, before the first recursive step, the encoder may include one block 420-a corresponding to N total bits and K information bits. Upon performing the first recursive step, the encoder may generate polarized channel group 410-a, where a first half of the channels 415 have a lower capacity and a second half of the channels 415 have a higher capacity. The first half of the channels 415 may correspond to a first sub-block 420-*b*, and the second half may correspond to sub-block 420-*c*. In the case describe above where N=8, each of these sub-blocks 420 may include four total bits.

The encoder may use the mutual information metrics to determine how many information bits to include in each sub-block 420. For example, the encoder may include a channel polarization mutual information transfer chart—or a table with functions or values representing the channel polarization mutual information transfer chart—in memory. The encoder may determine target mutual information for the input channel 415 W based at least in part on the target coding rate R. For example, as described above, a codeword of length N=8 containing a number of information bits K=4 may result in a target code rate of R=K/N=1/2. Based at least in part on the target mutual information for the input channel 415 W and the channel polarization mutual information transfer chart, the encoder may determine the target mutual information for the output channels 415 W− and W+, where the target mutual information values may be referred to as Cap(W−) and Cap(W+), respectively. The encoder may then determine the information bits K0 to include in the first sub-block 420-*b* and the information bits K1 to include in the second sub-block 420-*c* according to the equations:

$$K0+K1=K \text{ and } K0/K1=Cap(W-)/Cap(W+),$$

such that the encoder allocates a number of information bits K0 to channels W− and a number of information bits K1 to channels W+ proportional to the capacity or mutual information of the channels W− and W+. For example, in the case described above, the encoder may allocate one information bit (i.e., K0=1) to the first sub-block 420-*b* and three information bits (i.e., K1=3) to the second sub-block 420-*c*. In some cases, the encoder may perform rounding to assign an integer number of information bits to each sub-block 420.

In a next step, the encoder may recursively perform the polarization process on each sub-block 420. For example, the encoder may polarize the channels 415 in sub-block 420-*b* to generate sub-blocks 420-*d* and 420-*e*. In this case, the input channels 415-*c* and 415-*e* may have channel capacities of W− (e.g., based at least in part on the polarization in the first step of the recursive process), and the corresponding output channels 415-*f* and 415-*g* may have resulting channel capacities of W−− (e.g., a lower channel capacity than W−) and W−+(e.g., a greater channel capacity than W−). In this way, polarized channel group 410-*b* may include channels 415 with greater polarization diversity than polarized channel group 410-*a*. Similar to the process described above, the encoder may implement the channel polarization mutual information transfer chart to determine the information bits to assign to sub-blocks 420-*d* and 420-*e*. For example, following this next step in the recursive polarization process, sub-block 420-*d* may have size N=2 and information bits K00=0, and sub-block 320 *e* may have size N=2 and information bits K01=1.

The encoder may continue this recursive process of polarization and information bit allocation until the sub-blocks 420 for a polarized channel group 410 are less than or equal to a pre-determined threshold sub-block size (e.g., 64, 128, 1024, and/or the like) with a pre-calculated bit channel reliability sequence. For example, the encoder may store a known bit sequence in memory (e.g., based at least in part on or derived by a PW, Gaussian approximation (GA) DE, mutual information DE, nested DE, or some similar technique) for one or more codeword sizes. In some cases, the encoder may store a bit sequence for a codeword of length 64 bits. In such cases, the encoder may terminate the recursive fractally enhanced kernel polar code construction 400 when the sub-blocks 420 for a polarized channel group 410 have a codeword length of 64 bits, and may allocate information bits within these 64 bit sub-blocks 420 based at least in part on the bit sequence stored in memory. In some cases, the encoder may store additional bit sequences for code blocks of sizes less than the threshold size (e.g., in case the input codeword contains fewer total bits than the threshold sub-block size, the encoder may allocate information bits without performing any recursive steps).

The above process may result in reliable polar-encoded codewords for input channels 415 with even channel capacities (e.g., all of the input channels start with capacities W). However, in some cases, an encoder may perform bit puncturing. For example, the encoder may receive a polar code with block length M for encoding. However, for the polar coding procedure, the encoder may need a number of channels N, where N=2^m for integer values of m. In such cases, the encoder may puncture a number of bits N-M in order to use the specified block length for polar coding. For example, the encoder may receive a block length M=7 for polar encoding. To perform the polar encoding procedure, the encoder may round the block length up to the nearest power of 2 (e.g., to satisfy the criteria for polar encoding where N=2^m for integer values of m). In this case, the encoder may determine N=8 for M=7, with one bit to block puncture. The encoder may perform unknown-bit puncturing (e.g., block puncturing) or known-bit puncturing (e.g., shortening). In the case of unknown-bit puncturing, the encoder may puncture the first bit of the codeword, corresponding to channel 415-*a*. In this case, the encoder may process the channel 415-*a* (e.g., and any other channels 415 corresponding to block punctured bits) as if the channel has a capacity and mutual information of 0. Additionally, in some cases, the encoder may determine capacities for the un-block punctured channels 415 based at least in part on the number of information bits, the total number of bits, and the number of block punctured bits. The encoder may use these uneven channel capacities, along with the channel polarization mutual information transfer chart in memory, to determine the information bit allocations for each sub-block 420.

In some cases (e.g., when implementing block puncturing), the uneven input channel capacities may result in generating inefficient or unreliable codewords. For example, in block puncturing, the bit puncturing is front-loaded within a codeword. As block punctured bits correspond to channel capacities of zero during the fractally enhanced kernel polar code construction 400, block puncturing may result in non-uniform polarization speeds for different sub-blocks 420 or bit channels 415. These channel capacities of zero may result in less polarization, and accordingly smaller values of K−/K+. The fractally enhanced kernel polar code construction 400, according to the properties of the channel polarization mutual information transfer chart, may allocate more information bits K− in the first half sub-block 420 than other polar coding schemes (e.g., DE schemes) when the value of K−/K+ is relatively small. As the bit channels 415 available in the first half of the codeword may have lower channel capacities than the bit channels in the second half of the codeword, this allocation of information bits may result in less reliable codewords (e.g., a number of the information bit channels 415 allocated in the first half of the codeword may have lower channel capacities than a number of frozen bit channels 415 in the second half of the codeword). To better allocate information bits to more reliable bit channels 415, the encoder may implement an adjusted information bit assignment process.

As indicated above, FIG. 4 is provided merely as an example. Other examples may differ from what is described with regard to FIG. 4.

For ultra-reliable low latency communications (URLLC), an incremental redundancy (IR)-hybrid automatic repeat request (HARQ) may need to be supported in order to meet high reliability needs. Low-density parity-check (LDPC) codes provide a natural and efficient way to implement IR-HARQ with degree-one extension structure. Currently, NR polar code defined for enhanced mobile broadband (eMBB) control channels does not support IR-HARQ for URLLC. In addition, NR polar code has limits on a maximum block length and/or a fixed rate matching scheme that can be implemented, thereby further limiting use of NR polar code for URLLC in NR. Using an adjusted fractally enhanced kernel polar code provides some advantages over using NR polar codes, such as no code length restrictions, improved performance, flexibility in extending to IR-HARQ, and/or the like. However, in some contexts, adjusted fractally enhanced polar codes may experience spikes in achievable signal-to-noise ratios (SNRs), thereby negatively impacting use of the adjusted fractally enhanced polar codes.

Some techniques and apparatuses described herein provide a wireless communication device that is capable of using a hybrid polar code design for URLLC. For example, some techniques and apparatuses may dynamically use puncturing and shortening for an adjusted fractally enhanced polar code based at least in part on a code rate of the adjusted fractally enhanced kernel polar code. Thus, some techniques and apparatuses described herein provide a wireless communication device that is capable of using puncturing and shortening in different situations. This reduces or eliminates spikes in achievable SNRs, thereby improving use of adjusted fractally enhanced kernel polar codes. In addition, this provides a way for the wireless communication device to maintain optimality of a configuration of blocks associated with an adjusted fractally enhanced kernel polar code. Further, this provides a way for the wireless communication device to generate adjusted fractally enhanced kernel polar codes without code rate restrictions and/or block length restrictions.

Figure 5:
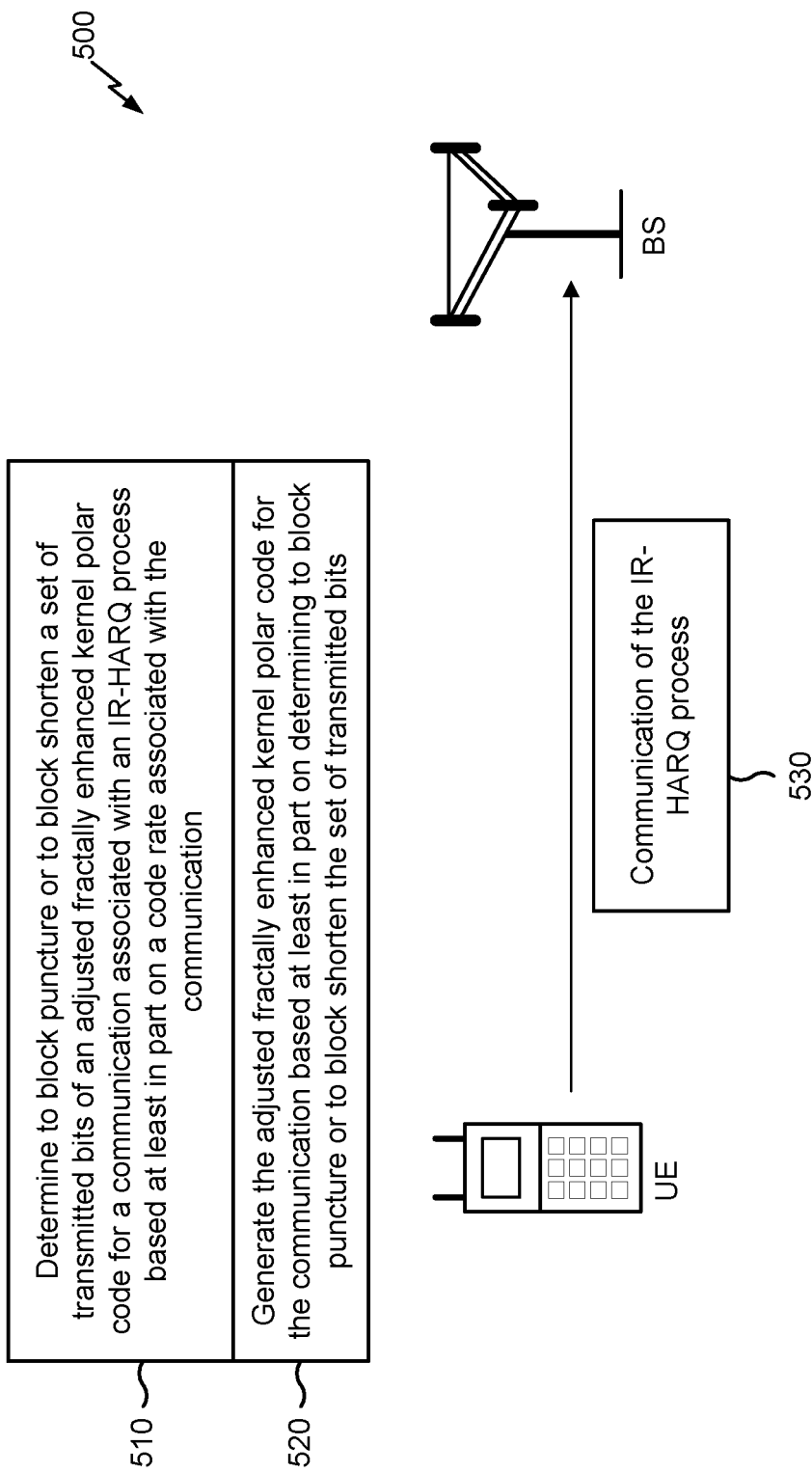
FIG. 5 is a diagram illustrating an example of hybrid polar code design for ultra-reliable low latency communications (URLLC), in accordance with various aspects of the present disclosure.

FIG. 5 is a diagram illustrating an example 500 of hybrid polar code design for ultra-reliable low latency communications (URLLC), in accordance with various aspects of the present disclosure. As shown in FIG. 5, example 500 includes a UE (e.g., UE 120) and a BS (e.g., BS 110).

As shown by reference number 510, the UE may determine to block puncture or to block shorten a set of transmitted bits (e.g., a codeword) of an adjusted fractally enhanced kernel polar code for a communication associated with an IR-HARQ process based at least in part on a code rate associated with the communication. For example, the UE may determine to block puncture or to block shorten the set of transmitted bits based at least in part on whether the code rate satisfies a threshold.

In some aspects, and as a specific example, the UE may determine to block puncture the set of transmitted bits based at least in part on the code rate failing to satisfy a threshold (e.g., being less than the threshold). In some aspects, and as another specific example, the UE may determine to block shorten the set of transmitted bits based at least in part on the code rate satisfying the threshold (e.g., being greater than or equal to the threshold). In some aspects, the threshold may be configured from an upper layer. For example, the threshold may be configured in association with a radio resource control (RRC) configuration.

In some aspects, the UE may separately determine whether to block puncture or to block shorten the set of transmitted bits for a set of sequential communications of an IR-HARQ process. For example, the UE may determine whether to block puncture or to block shorten for a first communication of the IR-HARQ process, may perform the same determination for a second communication of the IR-HARQ process independently from the determination made for the first communication, and so forth. This facilitates optimization of use of block puncturing and block shortening for a set of communications, and thereby improves network operations. In some aspects, the UE may determine to block puncture or to block shorten different communications associated with the same IR-HARQ process in different manners. For example, the UE may determine to block shorten the set of transmitted blocks for a first communication of an IR-HARQ process, may determine to block puncture the set of transmitted blocks for a second communication of the same IR-HARQ process, and/or the like. Additionally, or alternatively, and as another example, the UE may determine to block shorten or to block puncture different quantities of transmitted bits for different communications associated with the same IR-HARQ process.

In some aspects, the UE may automatically determine whether to block puncture or to block shorten the adjusted fractally enhanced kernel polar code for a first communication of an IR-HARQ process. In some aspects, the UE may determine whether to block puncture or to block shorten the adjusted fractally enhanced kernel polar code for a subsequent communication based at least in part on receiving a negative acknowledgment (NACK), or another indication that a previous communication of the IR-HARQ process has failed, such as expiration of a timer without receiving an acknowledgment (ACK), reception of another type of message from a device to which the previous communication was destined, and/or the like. In other words, the UE may not generate an adjusted fractally enhanced kernel polar code for a subsequent communication if the previous communication is successful, if the previous communication results in an ACK from a destination device, and/or the like.

In some aspects, a code rate may be based at least in part on a quantity of information bits associated with the communication and/or a quantity of transmitted bits associated with the communication (e.g., a quantity of transmitted bits that is actually transmitted in association with a communication). For example, a code rate may be a ratio of information bits (K) to transmitted bits (M), and may be represented by the quantity K/M. In some aspects, the code rate may change between communications associated with the same IR-HARQ process. For example, a first communication may have a first code rate of 4/6, a second communication may have a second code rate of 4/10, a third communication may have a third code rate of 6/14, and/or the like.

As shown by reference number 520, the UE may generate the adjusted fractally enhanced kernel polar code for the communication based at least in part on determining to block puncture or to block shorten the set of transmitted bits. For example, the UE may generate the adjusted fractally enhanced kernel polar code after determining to block puncture or to block shorten the set of transmitted bits.

In some aspects, the UE may generate an adjusted fractally enhanced kernel polar code with a particular block length. For example, the UE may generate an adjusted fractally enhanced kernel polar code with a block length equal to a closest integer power of two greater than or equal to the quantity of transmitted bits that is actually to be transmitted. Continuing with the previous example, the UE may generate the block length of the adjusted fractally enhanced kernel polar code according to an equation such as:

$$N = 2^{ceil(\log 2(M))},$$

where N is the block length, ceil ( ) is a ceiling function, and M is the quantity of transmitted bits included in the set of transmitted bits associated with the communication (e.g., a block length of a communication, a quantity of transmitted bits that is actually to be transmitted). As specific examples, if M equals 6, then the UE would generate a block length of 8; if M equals 14, then the UE would generate a block length of 16, and so forth, since 8 is the closest integer power of two greater than or equal to 6, 16 is the closest integer power of two greater than or equal to 14, and so forth. In some aspects, and for a subsequent communication, the adjusted fractally enhanced kernel polar code may be generated with a block length equal to a closest integer power of two greater than or equal to a total quantity of transmitted bits for communications associated with the IR-HARQ process. For example, for a second transmission, the block length for an adjusted fractally enhanced kernel polar code may be based at least in part on the total quantity of transmitted bits for the first communication and the second communication. Continuing with the previous example, if a first communication has a code rate of 4/6 and a second communication has a code rate of 4/10, the block length of the adjusted fractally enhanced kernel polar code for the second communication would be based at least in part on 10, rather than 6, even though 6 is the difference between the quantity of transmitted bits that are actually to be transmitted for the first communication and the second communication.

In some aspects, the UE may puncture or shorten a set of transmitted bits equal to a difference between the block length of the adjusted fractally enhanced kernel polar code and the quantity of transmitted bits actually transmitted in association with a communication. For example, if the block length equals 10, but the quantity of transmitted bits actually transmitted equals 6, then the UE would shorten or puncture the set of transmitted bits by 4 bits. In some aspects, if the UE is puncturing the set of transmitted bits, the UE may puncture the front-most bits of the set of transmitted bits to form a set of block punctured bits. Additionally, or alternatively, if the UE is shortening the set of transmitted bits, the UE may shorten the end-most bits of the set of transmitted bits to form a set of block shortened bits.

In some aspects, and for a subsequent communication, the UE may puncture or shorten by a quantity equal to a difference between an integer power of two used for the block length of the adjusted fractally enhanced kernel polar code for the subsequent communication and a total quantity of transmitted bits actually transmitted for communications associated with the IR-HARQ process. For example, if the adjusted fractally enhanced kernel polar code for the subsequent communication has a block length of 10 and there are 6 transmitted bits associated with communications of the IR-HARQ process that are actually transmitted, then the UE would puncture or shorten 4 transmitted bits.

In some aspects, the UE may puncture the set of transmitted bits from a first end of the set of transmitted bits. For example, the UE may puncture consecutive bits of the set of transmitted bits from the first end of the set of transmitted bits. In some aspects, the UE may shorten the set of transmitted bits from another end of the set of transmitted bits. For example, the UE may shorten consecutive bits of the set of transmitted bits from a second end of the set of transmitted bits.

In some aspects, the UE may determine a configuration of the set of information bits based at least in part on the block length. For example, the UE may determine which bits of the block length are to be the set of information bits and which bits of the block length are to be a set of frozen bits (e.g., that have a default value). In some aspects, the UE may determine the configuration of the set of information bits by dividing the block length into two half block lengths. For example, the UE may divide a 16 bit block length into two 8 bit half block lengths (e.g., may divide N by 2). In some aspects, the UE may determine a configuration of the set of information bits for the half block lengths. For example, the UE may determine to allocate some bits of the set of information bits to a first half block length and may determine to allocate the remaining bits of the set of information bits to the second half block length.

In some aspects, the UE may determine to allocate the set of information bits among a first half block length and a second half block length based at least in part on a mutual information allocation formula. For example, the UE may determine to allocate the set of information bits among the first half block length and the second half block length such that a quantity of information bits allocated to a half block length is proportional to a capacity or mutual information of the first half block length and the second half block length (e.g., a proportion of target information values of the first half block length and the second half block length), as described elsewhere herein. Additionally, or alternatively, the UE may determine to allocate the set of information bits among the first half block length and the second half block length based at least in part on an adjusted quantity of information bits (e.g., excluding information bits associated with punctured or shortened bits). In some aspects, information bits included in the adjusted quantity of information bits with a lowest reliability may be removed from a selected information bit set.

In some aspects, a first subset of information bits for a first half block length and a second subset of information bits for a second half block length may be associated with a pre-generated sequence. For example, the pre-generated sequence may have a fixed reliability order that identifies a relative reliability of different information bits of the first subset of information bits and the second subset of information bits. As specific examples, the pre-generated sequence may be a partial weight (PW) order, a sequence from a numerical search, and/or the like. This reduces a complexity of selecting a set of most reliable bits (described below), thereby conserving processing resources of the UE relative to not using a pre-generated sequence.

In some aspects, the UE may select a set of most reliable bits from the first subset of information bits and the second subset of information bits. In some aspects, the UE may select the set of most reliable bits based at least in part on excluding information bits that correspond to a set of block punctured bits and/or to a set of block shortened bits. In some aspects, the UE may select a set of most reliable bits based at least in part on the pre-generated sequence associated with the set of information bits. In some aspects, the UE may select a set of most reliable bits for a subsequent communication from the whole set of bits but excluding a set of frozen bits associated with the previous communication.

In some aspects, for a subsequent communication, the UE may identify a set of common information bits between a set of most reliable information bits for the subsequent communication and another set of most reliable bits for a most recent communication prior to the subsequent communication. For example, the UE may identify information bits that are common to both the set of most reliable bits and the other set of most reliable bits. In some aspects, the UE may copy a subset of information bits that is included in the set of common information bits to the set of most reliable bits associated with the subsequent communication. In this way, the UE optimizes reliability of information bits associated with subsequent communications.

As shown by reference number 530, the UE may transmit the communication of the IR-HARQ process using the adjusted fractally enhanced kernel polar code. For example, the UE may transmit the communication after generating the adjusted fractally enhanced kernel polar code.

In some aspects, the UE may monitor for an ACK or a NACK associated with the communication from a destination device (e.g., a BS in this case). In some aspects, if the UE receives an ACK, then the UE may terminate the IR-HARQ process. Conversely, if the UE receives a NACK, then the UE may repeat the IR-HARQ process. For example, if the UE receives a NACK for a first communication of an IR-HARQ process, then the UE may determine to transmit a second communication, may determine whether to block puncture or to block shorten an adjusted fractally enhanced kernel polar code for the second communication, may generate the adjusted fractally enhanced kernel polar code for the second communication, may transmit the second communication, and/or the like in a manner similar to that described elsewhere herein. In some aspects, the UE may terminate the IR-HARQ process after determining that a threshold quantity of communications associated with the IR-HARQ process have been transmitted (e.g., a maximum quantity of communications). This conserves processing resources of the UE by reducing or eliminating unneeded communications.

As indicated above, FIG. 5 is provided as an example. Other examples differ from what is described with respect to FIG. 5. Although FIG. 5 is described in the context of a UE performing various operations, the aspects apply equally to a BS performing one or more or all of these operations.

Figure 6A:
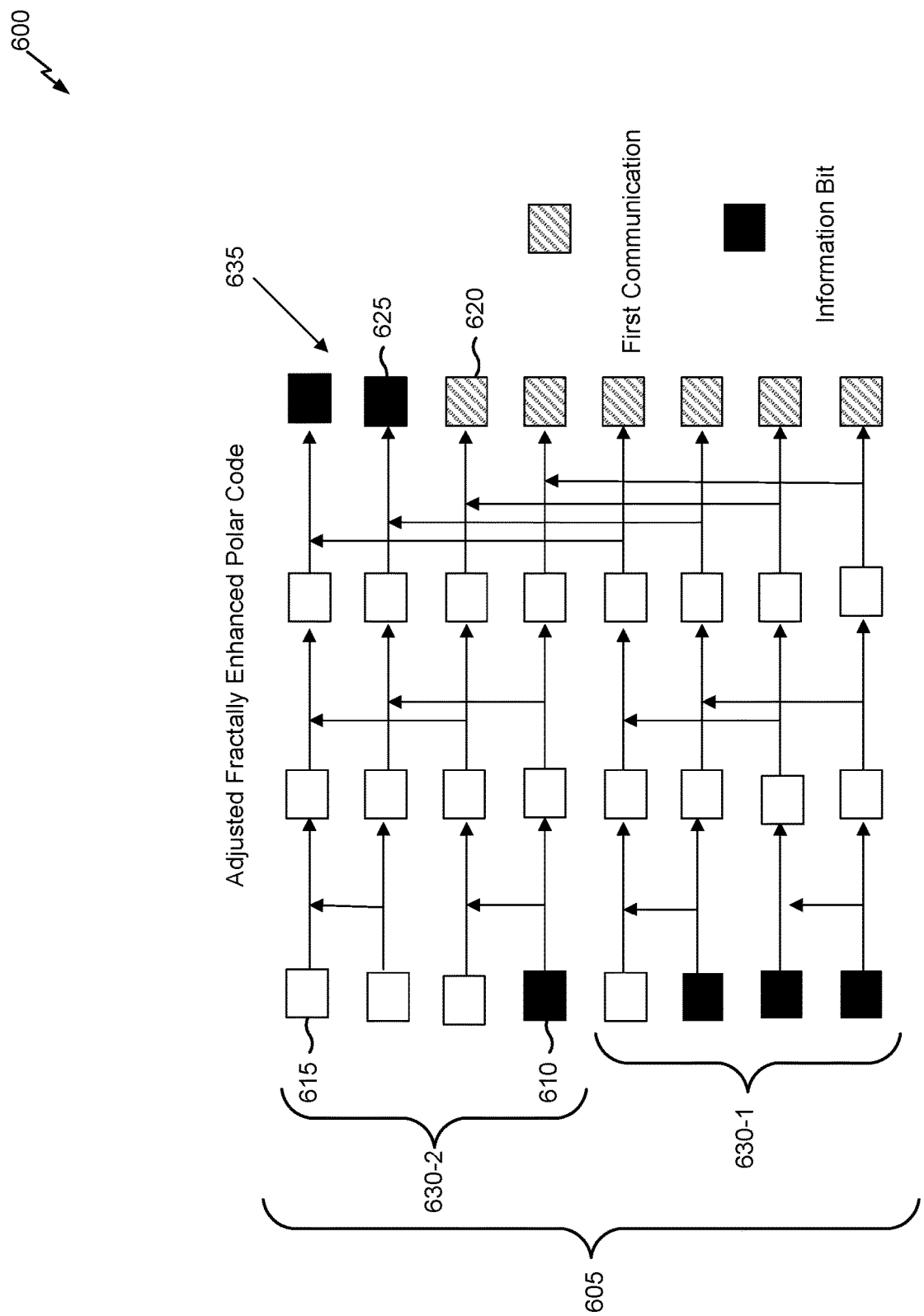
FIGS. 6A-6C are diagrams illustrating an example of hybrid polar code design for URLLC, in accordance with various aspects of the present disclosure.
Figure 6B:
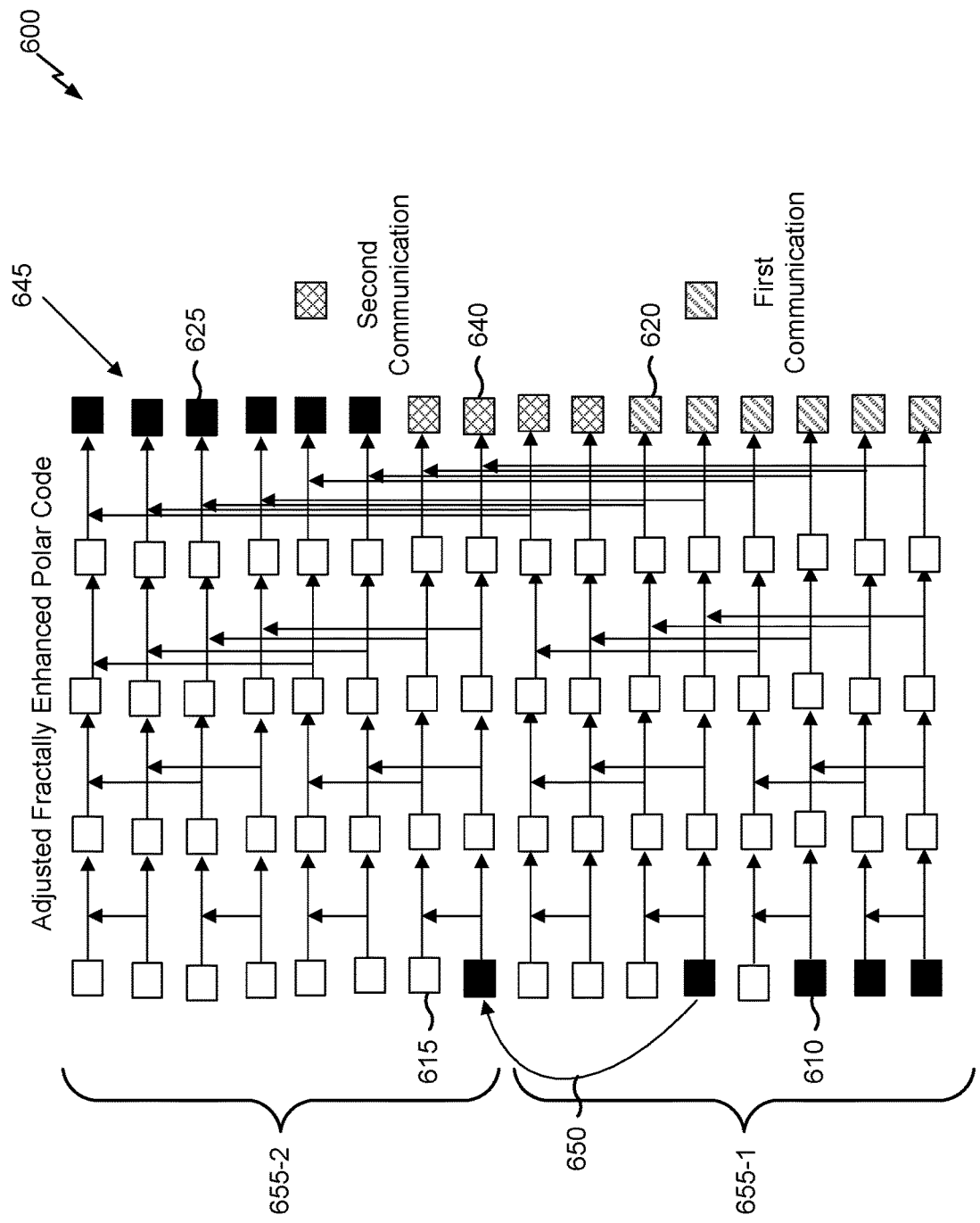
Figure 6C:
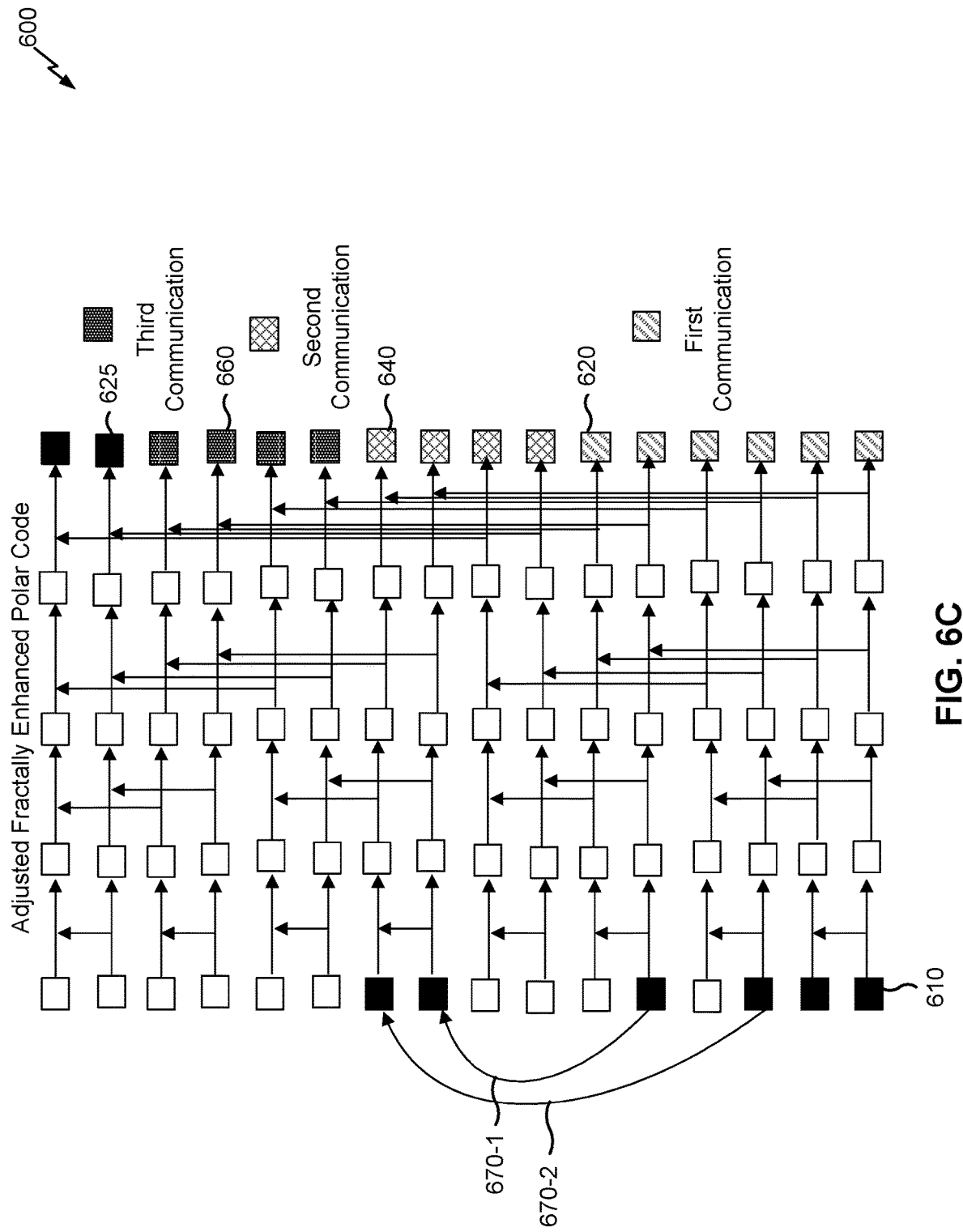

FIGS. 6A-6C are diagrams illustrating an example 600 of hybrid polar code design for URLLC, in accordance with various aspects of the present disclosure. Assume for example 600 that the UE is to block puncture bits for three different communications of an IR-HARQ process.

FIG. 6A shows a configuration of an adjusted fractally enhanced kernel polar code for a first communication of the IR-HARQ process. As shown, the adjusted fractally enhanced kernel polar code may have a block length 605. For example, the block length 605 may be 8 bits. As further shown, the adjusted fractally enhanced kernel polar code may include information bits 610 (black boxes), frozen bits 615 (white boxes), transmitted bits 620 for the first communication (diagonal stripped boxes) (e.g., transmitted bits that are actually transmitted), and block punctured bits 625 (gray boxes) (e.g., transmitted bits that are scheduled but not transmitted). As further shown, the adjusted fractally enhanced kernel polar code may have two half block lengths 630 (e.g., 630-1 and 630-2).

As shown by reference number 635, the UE may have block punctured the two front-most bits of the block length based at least in part on a difference between a set of transmitted bits associated with the first communication and a block length of the adjusted fractally enhanced kernel polar code, in a manner similar to that described elsewhere herein. In some aspects, the UE may determine a configuration of information bits 610 in a manner similar to that described elsewhere herein. For example, the UE may select a set of most reliable bits from the half block length 630-1 and the half block length 630-2 based at least in part on a pre-generated sequence and based at least in part on determining a quantity of bits included in half block lengths 630-1 and 630-2. In some aspects, the UE may transmit the first communication after generating the adjusted fractally enhanced kernel polar code. In some aspects, the UE may monitor for an ACK or a NACK after transmitting the first communication.

Turning to FIG. 6B, the UE may generate the fractally enhanced kernel polar code for a second communication (e.g., based at least in part on receiving a NACK in association with the first communication). As further shown in FIG. 6B, the adjusted fractally enhanced kernel polar code for the second communication may have a different block length than the adjusted fractally enhanced kernel polar code for the first communication (e.g., based at least in part on having a different code rate than the first communication). As further shown, the adjusted fractally enhanced kernel polar code may include a set of transmitted bits 640 (hashed boxes) associated with the second communication (e.g., transmitted bits that are actually transmitted). In some aspects, the UE may determine the quantity of transmitted bits 640 based at least in part on a difference between a quantity of transmitted bits associated with the second communication and a quantity of transmitted bits 620 associated with the first communication (based at least in part on code rates of the first communication and the second communication). As shown by reference number 645, the adjusted fractally enhanced kernel polar code may include a set of block punctured bits 625 based at least in part on a block length of the adjusted fractally enhanced kernel polar code and a block length of the second communication, in a manner similar to that described elsewhere herein.

As shown by reference number 650, the UE may copy some of the information bits 610 from the first communication to the second communication. For example, the UE may determine a set of most reliable bits for the second communication from the first half block length 655-1 and the second half block length 655-2 associated with the first communication and the second communication, but may exclude frozen bits 615 associated with the first communication and information bits associated with the set of block punctured bits associated with the second communication. Continuing with the previous example, the UE may identify a set of common bits among a set of most reliable bits associated with the first communication and another set of most reliable bits associated with the second communication, and may copy information bits 610 from the set of common bits to the set of most reliable bits for the second communication. In some aspects, the set of information bits 610 that is copied may be copied from a first half block length 655-1 of the adjusted fractally enhanced kernel polar code to a second half block length 655-2 of the adjusted fractally enhanced kernel polar code.

Turning to FIG. 6C, the UE may generate the adjusted fractally enhanced kernel polar code for a third communication in a manner similar to that described elsewhere herein. For example, the adjusted fractally enhanced kernel polar code may include a set of communication bits 660 associated with the third communication. As shown by reference numbers 670-1 and 670-2, the UE may copy information bits from a first half block length of the adjusted fractally enhanced kernel polar code to a second half block length of the adjusted fractally enhanced kernel polar code in a manner similar to that described elsewhere herein.

As indicated above, FIGS. 6A-6C are provided as an example. Other examples may differ from what is described with respect to FIG. 6A-6C.

Figure 7A:
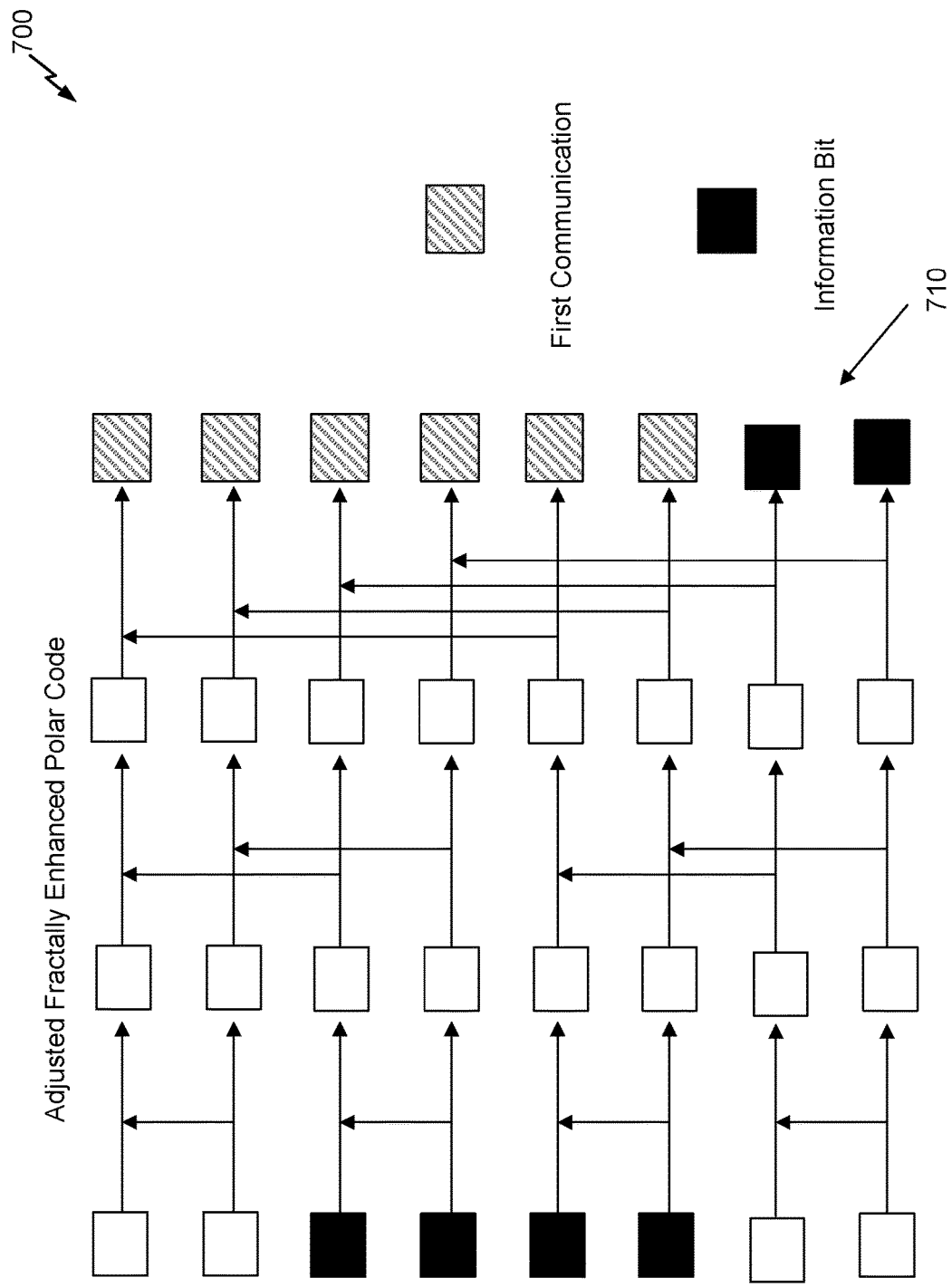
FIGS. 7A-7C are diagrams illustrating an example of hybrid polar code design for URLLC, in accordance with various aspects of the present disclosure.
Figure 7B:
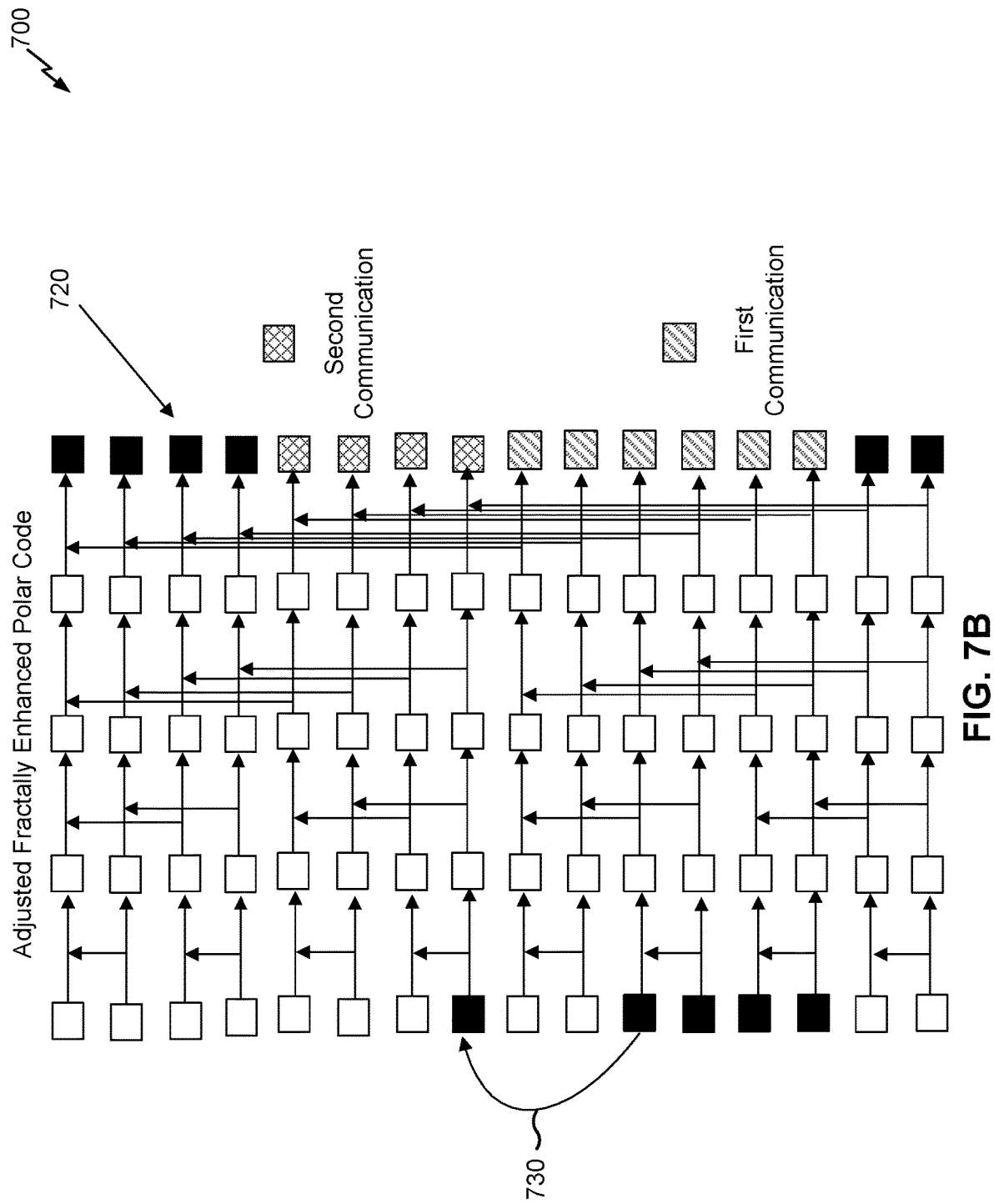
Figure 7C:
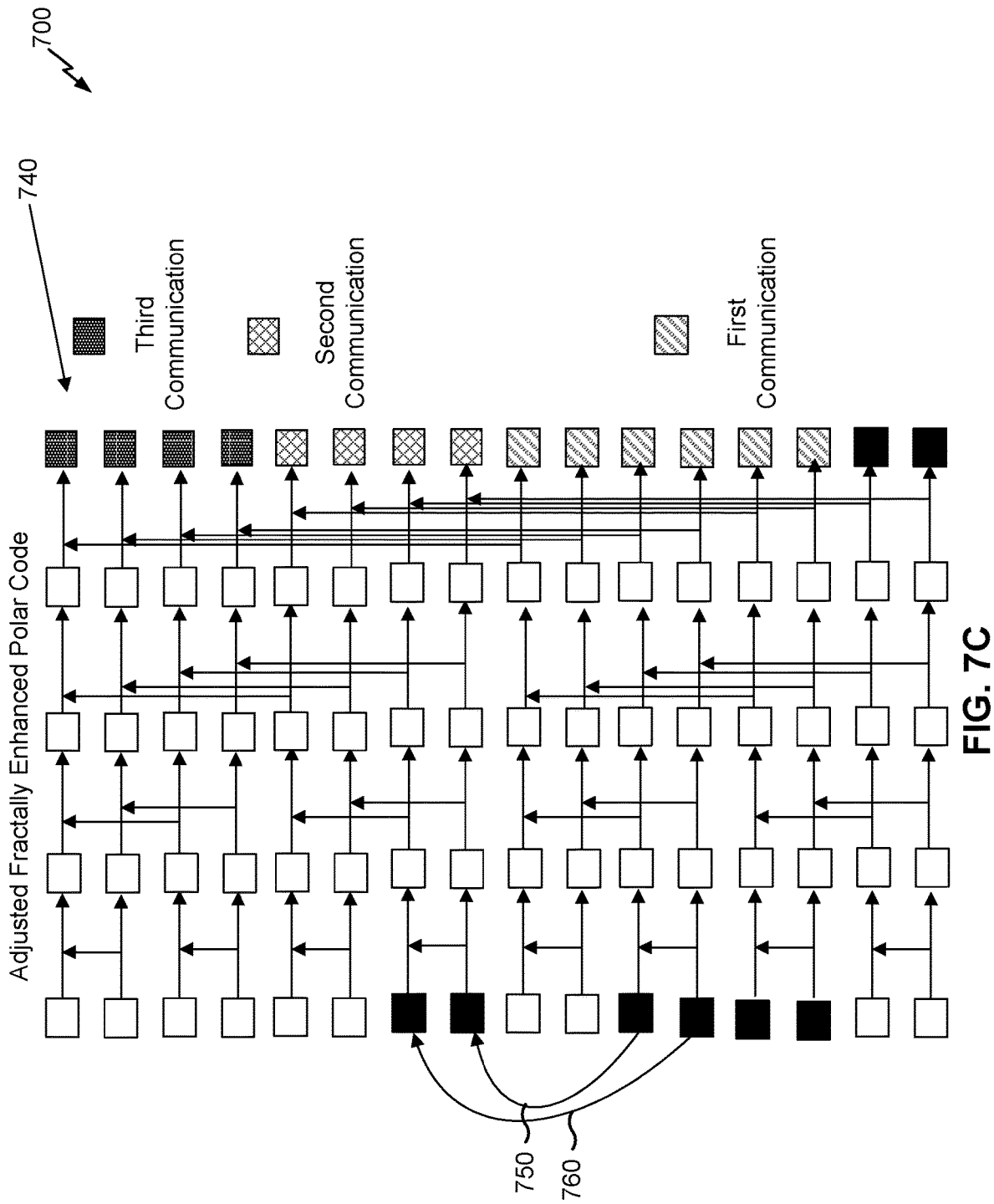

FIGS. 7A-7C are diagrams illustrating an example 700 of hybrid polar code design for URLLC, in accordance with various aspects of the present disclosure. In example 700, the UE may block shorten communication bits for a first communication of an IR-HARQ process and puncture bits for two subsequent communications of the IR-HARQ process.

In some aspects, the adjusted fractally enhanced kernel polar code may include information bits, transmitted bits, frozen bits, and/or the like, similar to that described elsewhere herein. As shown in FIG. 7A, and by reference number 710, the UE may shorten transmitted bits in a manner similar to that described elsewhere herein. For example, the UE may shorten the end-most transmitted bits of the adjusted fractally enhanced kernel polar code. As further shown in FIG. 7A, the information bits associated with the adjusted fractally enhanced kernel polar code may be configured in a different manner than that described with regard to FIG. 6A, based at least in part on the UE using shortening rather than puncturing for the first communication.

As shown in FIG. 7B, and by reference number 720, the UE may puncture a set of transmitted bits of the adjusted fractally enhanced kernel polar code, in a manner similar to that described elsewhere herein. In some aspects, and as further shown in FIG. 7B, the UE may maintain a set of block shortened bits described with regard to FIG. 7A when puncturing the set of transmitted bits for the second communication. As shown by reference number 730, the UE may copy information bits from the first communication to the second communication. For example, the UE may select a set of most reliable bits from a set of information associated with the second communication and the first communication, excluding a set of frozen bits associated with the first communication, and a set of information bits associated with a set of punctured bits associated with the second communication. In some aspects, and continuing with the previous example, the UE may identify a set of common bits among a set of most reliable bits for the first communication and another set of most reliable bits for the second communication, and may copy information bits included in the set of common bits to the other set of most reliable bits associated with the second communication.

Turning to FIG. 7C, and as shown by reference number 740, the set of block punctured bits described with regard to FIG. 7B may be used for transmitted bits associated with a third communication when the block length of the adjusted fractally enhanced kernel polar code does not change between the second communication and the third communication. As shown by reference numbers 750 and 760, the UE may copy information bits in a manner similar to that described elsewhere herein.

As indicated above, FIGS. 7A-7C are provided as an example. Other examples may differ from what is described with respect to FIG. 7A-7C.

Figure 8:
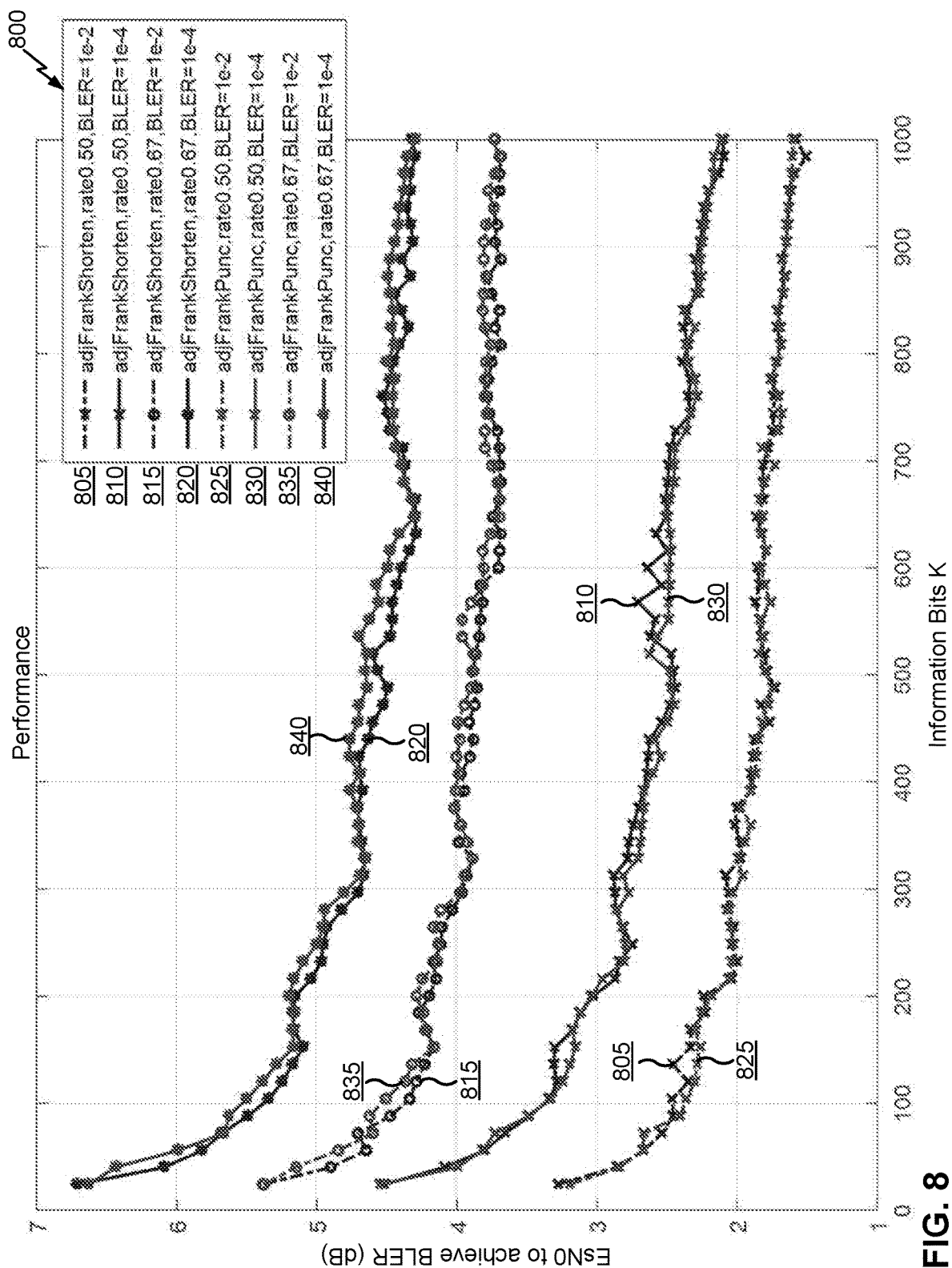
FIG. 8 is a diagram illustrating an example of hybrid polar code design for URLLC, in accordance with various aspects of the present disclosure.

FIG. 8 is a diagram illustrating an example 800 of hybrid polar code design for URLLC, in accordance with various aspects of the present disclosure. FIG. 8 shows example results of determining the threshold rate of utilizing shortening or puncturing in the manner described herein in different contexts. For example, at a rate greater than 0.5, a polar code utilizing shortening in general may have better performance than a polar code with puncturing. At a rate less than or equal to 0.5, a polar code utilizing puncturing may have better performance than a polar code with shortening. Thus, the threshold code rate may be determined as 0.5.

As indicated above, FIG. 8 is provided as an example. Other examples may differ from what is described with respect to FIG. 8.

Figure 9:
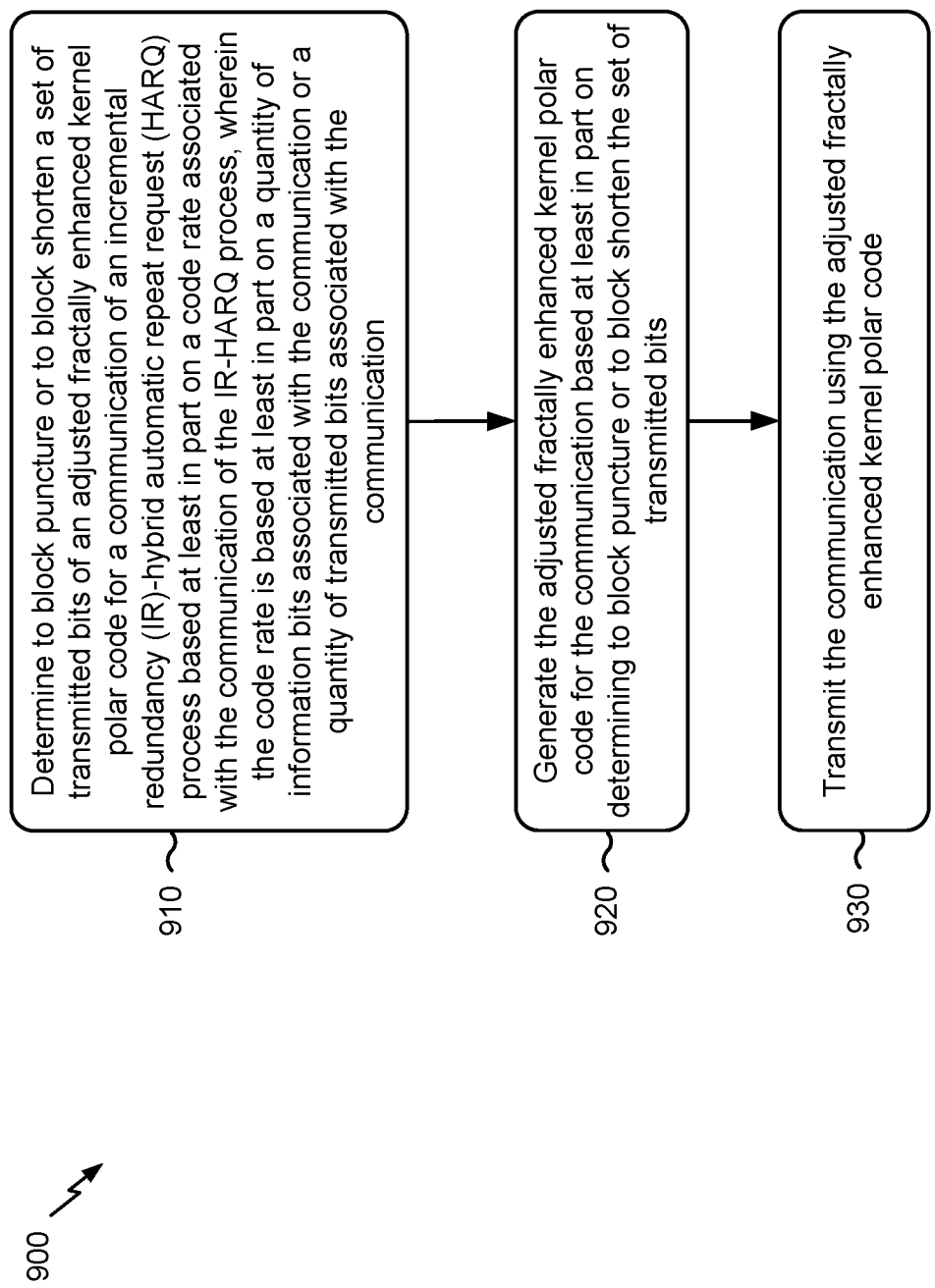

FIG. 9 is a diagram illustrating an example process 900 performed, for example, by a wireless communication device, in accordance with various aspects of the present disclosure. Example process 900 is an example where a wireless communication device (e.g., BS 110, UE 120, and/or the like) performs hybrid polar code operations for URLLC.

As shown in FIG. 9, in some aspects, process 900 may include determining to block puncture or to block shorten a set of transmitted bits of an adjusted fractally enhanced kernel polar code for a communication of an incremental redundancy (IR)-hybrid automatic repeat request (HARQ) process based at least in part on a code rate associated with the communication of the IR-HARQ process, wherein the code rate is based at least in part on a quantity of information bits associated with the communication or a quantity of transmitted bits associated with the communication (block 910). For example, the wireless communication device (e.g., BS 110 using controller/processor 240; UE 120 using controller/processor 280; and/or the like) may determine to block puncture or to block shorten a set of transmitted bits of an adjusted fractally enhanced kernel polar code for a communication of an IR-HARQ process based at least in part on a code rate associated with the communication of the IR-HARQ process, as described above. In some aspects, the code rate is based at least in part on a quantity of information bits associated with the communication or a quantity of transmitted bits associated with the communication.

As further shown in FIG. 9, in some aspects, process 900 may include generating the adjusted fractally enhanced kernel polar code for the communication based at least in part on determining to block puncture or to block shorten the set of transmitted bits (block 920). For example, the wireless communication device (e.g., BS 110 using controller/processor 240; UE 120 using controller/processor 280; and/or the like) may generate the adjusted fractally enhanced kernel polar code for the communication based at least in part on determining to block puncture or to block shorten the set of transmitted bits, as described above.

As further shown in FIG. 9, in some aspects, process 900 may include transmitting the communication using the adjusted fractally enhanced kernel polar code (block 930). For example, the wireless communication device (e.g., BS 110 using controller/processor 240, transmit processor 220, TX MIMO processor 230, MOD 232, antenna 234; UE 120 using antenna 252, MOD 254, transmit processor 264, TX MIMO processor 266, controller/processor 280; and/or the like) may transmit the communication using the adjusted fractally enhanced kernel polar code, as described above.

Process 900 may include additional aspects, such as any single aspect or any combination of aspects described below and/or in connection with one or more other processes described elsewhere herein.

In a first aspect, the wireless communication device may determine to block shorten the set of transmitted bits based at least in part on the code rate satisfying a threshold, wherein the block shortening is performed on consecutive bits at a first end of the set of transmitted bits, or may determine to block puncture the set of transmitted bits based at least in part on the code rate not satisfying the threshold, wherein the threshold is configured from an upper level, and wherein the block puncturing is performed on other consecutive bits at a second end of the set of transmitted bits.

In a second aspect, alone or in combination with the first aspect, the wireless communication device may generate the adjusted fractally enhanced kernel polar code with a block length equal to a closest integer power of two greater than or equal to the quantity of transmitted bits associated with the communication based at least in part on determining to block puncture the set of transmitted bits, and may puncture, to form a set of block punctured bits, a quantity of the set of transmitted bits for the communication equal to a difference between the block length of the adjusted fractally enhanced kernel polar code and the quantity of transmitted bits for the communication.

In a third aspect, alone or in combination with one or more of the first and second aspects, the wireless communication device may determine a quantity of a first subset of information bits for a first half block length of the block length and a quantity of a second subset of information bits for a second half block length of the block length based at least in part on a mutual information allocation formula.

In a fourth aspect, alone or in combination with one or more of the first through third aspects, the wireless communication device may generate the first subset of information bits for the first half block length and the second subset of information bits for the second half block length based at least in part on a pre-generated sequence, and may select a set of most reliable bits from the first subset of information bits and the second subset of information bits based at least in part on the pre-generated sequence.

In a fifth aspect, alone or in combination with one or more of the first through fourth aspects, the wireless communication device may receive a negative acknowledgement (NACK) for the communication after transmitting the communication, wherein the communication included a set of block punctured bits; may generate the fractally enhanced kernel polar code for a subsequent communication with a block length equal to a closest integer power of two greater than or equal to a total quantity of transmitted bits for communications associated with the IR-HARQ process based at least in part on receiving the NACK, and may puncture, to form another set of block punctured bits, a quantity of the set of transmitted bits, for the subsequent communication, equal to a difference between the closest integer power of two for the subsequent communication and the total quantity of transmitted bits for the communications associated with the IR-HARQ process.

In a sixth aspect, alone or in combination with one or more of the first through fifth aspects, the wireless communication device may select a set of most reliable bits from a set of information bits for the subsequent communication by excluding a set of frozen bits associated with the previous communication after puncturing the quantity of the set of transmitted bits, for the subsequent communication, to form another set of block punctured bits.

In a seventh aspect, alone or in combination with one or more of the first through sixth aspects, the wireless communication device may identify a set of common information bits between the set of most reliable bits and another set of most reliable bits associated with the previous communication after selecting the set of most reliable bits, and may copy a subset of information bits that is included in the set of common information bits to the set of most reliable bits after identifying the set of common information bits.

In an eighth aspect, alone or in combination with one or more of the first through seventh aspects, the wireless communication device may generate the adjusted fractally enhanced kernel polar code with a block length equal to a closest integer power of two greater than or equal to the quantity of transmitted bits associated with the communication based at least in part on determining to block shorten the set of transmitted bits, and may shorten, to form a set of block shortened bits, a quantity of the set of transmitted bits for the communication equal to a difference between the block length of the adjusted fractally enhanced kernel polar code and the quantity of transmitted bits for the communication.

In a ninth aspect, alone or in combination with one or more of the first through eighth aspects, the wireless communication device may determine a first subset of information bits for a first half block length of the block length and a second subset of information bits for a second half block length of the block length based at least in part on a mutual information allocation formula, and an adjusted quantity of information bits, wherein information bits of the adjusted quantity of information bits with a lowest reliability are removed from a selected information bit set.

In a tenth aspect, alone or in combination with one or more of the first through ninth aspects, the wireless communication device may generate the first subset of information bits for the first half block length and the second subset of information bits for the second half block length based at least in part on a pre-generated sequence, and may select a set of most reliable bits from the first subset of information bits and the second subset of information bits excluding the set of block shortened bits based at least in part on the pre-generated sequence.

In an eleventh aspect, alone or in combination with one or more of the first through tenth aspects, the wireless communication device may receive a negative acknowledgement (NACK) for the communication after transmitting the communication, wherein the communication included a set of block shortened bits, may generate the fractally enhanced kernel polar code for a subsequent communication with a block length equal to a closest integer power of two greater than or equal to a quantity of transmitted bits for the subsequent communication based at least in part on receiving the NACK, and may puncture, to form a set of block punctured bits, a quantity of the set of transmitted bits, for the subsequent communication, equal to a difference between the block length of the adjusted fractally enhanced kernel polar code and the quantity of transmitted bits for the subsequent communication.

In a twelfth aspect, alone or in combination with one or more of the first through eleventh aspects, the wireless communication device may select a set of most reliable bits from a set of information bits for the subsequent communication and another set of information bits for a previous communication excluding a set of frozen bits associated with the previous communication based at least in part on puncturing the quantity of the set of transmitted bits, for the subsequent communication, to form the set of block punctured bits.

In a thirteenth aspect, alone or in combination with one or more of the first through twelfth aspects, the wireless communication device may identify a set of common information bits between the set of most reliable bits and another set of most reliable bits associated with the previous communication after selecting the set of most reliable bits, and may copy a subset set of information bits that is included in the set of common information bits to the set of most reliable bits after identifying the set of common information bits.

In a fourteenth aspect, alone or in combination with one or more of the first through thirteenth aspects, the wireless communication device may determine that a threshold quantity of communications associated with the IR-HARQ process have been transmitted based at least in part on transmitting the communication, or may receive an acknowledgement (ACK) for the communication based at least in part on transmitting the communication, and may terminate the IR-HARQ process based at least in part on determining that the threshold quantity of communications have been transmitted or based at least in part on receiving the ACK.

Although FIG. 9 shows example blocks of process 900, in some aspects, process 900 may include additional blocks, fewer blocks, different blocks, or differently arranged blocks than those depicted in FIG. 9. Additionally, or alternatively, two or more of the blocks of process 900 may be performed in parallel.

FIG. 10 is a diagram illustrating an example process 1000 performed, for example, by a wireless communication device, in accordance with various aspects of the present disclosure. Example process 1000 is an example where a wireless communication device (e.g., BS 110, UE 120, and/or the like) performs operations associated with hybrid polar code operations for URLLC.

As shown in FIG. 10, in some aspects, process 1000 may include receiving a communication, of an incremental redundancy (IR)-hybrid automatic repeat request (HARQ) process, that is encoded using an adjusted fractally enhanced kernel polar code (block 1010). For example, the wireless communication device (e.g., BS 110 using controller/processor 240, receive processor 238, MIMO detector 236, DEMOD 232, antenna 234; UE 120 using antenna 252, DEMOD 254, MIMO detector 256, receive processor 258, controller/processor 280; and/or the like) may receive a communication, of an IR-HARQ process, that is encoded using an adjusted fractally enhanced kernel polar code, as described above.

As further shown in FIG. 10, in some aspects, process 1000 may include identifying a block puncturing pattern or a block shortening pattern based at least in part on a code rate associated with the communication, wherein the code rate is based at least in part on a quantity of information bits associated with the communication or a quantity of transmitted bits associated with the communication (block 1020). For example, the wireless communication device (e.g., BS 110 using controller/processor 240; UE 120 using controller/processor 280; and/or the like) may identify a block puncturing pattern or a block shortening pattern based at least in part on a code rate associated with the communication, as described above. In some aspects, the code rate is based at least in part on a quantity of information bits associated with the communication or a quantity of transmitted bits associated with the communication.

As further shown in FIG. 10, in some aspects, process 1000 may include determining a location of the information bits in the communication based at least in part on the block puncturing pattern or the block shortening pattern (block 1030). For example, the wireless communication device (e.g., BS 110 using controller/processor 240; UE 120 using controller/processor 280; and/or the like) may determine a location of the information bits in the communication based at least in part on the block puncturing pattern or the block shortening pattern, as described above.

As further shown in FIG. 10, in some aspects, process 1000 may include decoding the communication based at least in part on determining the location of the information bits (block 1040). For example, the wireless communication device (e.g., BS 110 using controller/processor 240, receive processor 238, MIMO detector 236, DEMOD 232, antenna 234; UE 120 using antenna 252, DEMOD 254, MIMO detector 256, receive processor 258, controller/processor 280; and/or the like) may decode the communication based at least in part on determining the location of the information bits, as described above.

Process 1000 may include additional aspects, such as any single aspect or any combination of aspects described below and/or in connection with one or more other processes described elsewhere herein.

In a first aspect, identifying the block puncturing pattern or the block shortening pattern comprises: identifying the block shortening pattern based at least in part on the code rate satisfying a threshold, or identifying the block puncturing pattern based at least in part on the code rate not satisfying the threshold.

Although FIG. 10 shows example blocks of process 1000, in some aspects, process 1000 may include additional blocks, fewer blocks, different blocks, or differently arranged blocks than those depicted in FIG. 10. Additionally, or alternatively, two or more of the blocks of process 1000 may be performed in parallel.

The foregoing disclosure provides illustration and description, but is not intended to be exhaustive or to limit the aspects to the precise form disclosed. Modifications and variations may be made in light of the above disclosure or may be acquired from practice of the aspects.

As used herein, the term component is intended to be broadly construed as hardware, firmware, or a combination of hardware and software. As used herein, a processor is implemented in hardware, firmware, or a combination of hardware and software.

As used herein, satisfying a threshold may, depending on the context, refer to a value being greater than the threshold, greater than or equal to the threshold, less than the threshold, less than or equal to the threshold, equal to the threshold, not equal to the threshold, and/or the like.

It will be apparent that systems and/or methods described herein may be implemented in different forms of hardware, firmware, or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the term "only one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communication performed by a wireless communication device, comprising:
   determining to block puncture or to block shorten a set of transmitted bits of an adjusted fractally enhanced kernel polar code for a communication of an incremental redundancy (IR)-hybrid automatic repeat request (HARQ) process based at least in part on a code rate associated with the communication of the IR-HARQ process,
      wherein the code rate is based at least in part on a quantity of information bits associated with the communication or a quantity of transmitted bits associated with the communication;
   generating the adjusted fractally enhanced kernel polar code for the communication based at least in part on determining to block puncture or to block shorten the set of transmitted bits; and
   transmitting the communication using the adjusted fractally enhanced kernel polar code.

2. The method of claim 1, wherein determining to block puncture or to block shorten the set of transmitted bits comprises:
   determining to block shorten the set of transmitted bits based at least in part on the code rate satisfying a threshold,
      wherein the block shortening is performed on consecutive bits at a first end of the set of transmitted bits, or
   determining to block puncture the set of transmitted bits based at least in part on the code rate not satisfying the threshold,
      wherein the threshold is configured from an upper layer,
      wherein the puncturing is performed on other consecutive bits at a second end of the set of transmitted bits.

3. The method of claim 1, wherein generating the adjusted fractally enhanced kernel polar code comprises:
   generating the adjusted fractally enhanced kernel polar code with a block length equal to a closest integer power of two greater than the quantity of transmitted bits associated with the communication based at least in part on determining to block puncture the set of transmitted bits; and
   puncturing, to form a set of block punctured bits, a quantity of the set of transmitted bits for the communication equal to a difference between the block length of the adjusted fractally enhanced kernel polar code and the quantity of transmitted bits for the communication.

4. The method of claim 3, further comprising:
   determining a first quantity of a first subset of information bits for first half block length of the block length and a second quantity of a second subset of information bits for a second half block length of the block length based at least in part on a mutual information allocation formula.

5. The method of claim 4, further comprising:
   generating the first subset of information bits for the first half block length and the second subset of information bits for the second half block length based at least in part on a pre-generated sequence; and
   selecting a set of most reliable bits from the first subset of information bits and the second subset of information bits based at least in part on the pre-generated sequence.

6. The method of claim 1,
   wherein the communication includes a set of block punctured bits, and
   wherein the method further comprises:
      receiving a negative acknowledgement (NACK) for the communication after transmitting the communication;
      generating the fractally enhanced kernel polar code for a subsequent communication with a block length equal to a closest integer power of two greater than or equal to a total quantity of transmitted bits for communications associated with the IR-HARQ process based at least in part on receiving the NACK; and
      puncturing, to form another set of block punctured bits, a quantity of the set of transmitted bits, for the subsequent communication, equal to a difference between the closest integer power of two for the subsequent communication and the total quantity of transmitted bits for the communications associated with the IR-HARQ process.

7. The method of claim 6, further comprising:
   selecting a set of most reliable bits from a set of information bits for the subsequent communication by excluding a set of frozen bits associated with a previous communication, after puncturing the quantity of the set of transmitted bits, for the subsequent communication, to form the other set of block punctured bits.

8. The method of claim 7, further comprising:
   identifying a set of common information bits between the set of most reliable bits and another set of most reliable bits associated with the previous communication after selecting the set of most reliable bits; and
   copying a subset of information bits that is included in the set of common information bits to the set of most reliable bits after identifying the set of common information bits.

9. The method of claim 1, wherein generating the adjusted fractally enhanced kernel polar code comprises:
   generating the adjusted fractally enhanced kernel polar code with a block length equal to a closest integer power of two greater than or equal to the quantity of transmitted bits associated with the communication based at least in part on determining to block shorten the set of transmitted bits; and
   shortening, to form a set of block shortened bits, a quantity of the set of transmitted bits for the communication equal to a difference between the block length of the adjusted fractally enhanced kernel polar code and the quantity of transmitted bits for the communication.

10. The method of claim 9, further comprising:
   determining a first subset of information bits for a first half block length of the block length and a second subset of information bits for a second half block length of the block length based at least in part on a mutual information allocation formula, and an adjusted quantity of information bits,
wherein information bits of the adjusted quantity of information bits with a lowest reliability are removed from a selected information bit set.

11. The method of claim 10, further comprising:
generating the first subset of information bits for the first half block length and the second subset of information bits for the second half block length based at least in part on a pre-generated sequence; and
selecting a set of most reliable bits from the first subset of information bits and the second subset of information bits excluding the set of block shortened bits based at least in part on the pre-generated sequence.

12. The method of claim 1,
wherein the communication includes a set of block shortened bits, and
wherein the method further comprises:
receiving a negative acknowledgement (NACK) for the communication after transmitting the communication;
generating the fractally enhanced kernel polar code for a subsequent communication with a block length equal to a closest integer power of two greater than or equal to a quantity of transmitted bits for the subsequent communication based at least in part on receiving the NACK; and
puncturing, to form a set of block punctured bits, a quantity of the set of transmitted bits, for the subsequent communication, equal to a difference between the block length of the adjusted fractally enhanced kernel polar code and the quantity of transmitted bits for the subsequent communication.

13. The method of claim 12, further comprising:
selecting a set of most reliable bits from a set of information bits for the subsequent communication and another set of information bits for a previous communication excluding a set of frozen bits associated with the previous communication based at least in part on puncturing the quantity of the set of transmitted bits, for the subsequent communication, to form the set of block punctured bits.

14. The method of claim 13, further comprising:
identifying a set of common information bits between the set of most reliable bits and another set of most reliable bits associated with the previous communication after selecting the set of most reliable bits; and
copying a subset set of information bits that is included in the set of common information bits to the set of most reliable bits after identifying the set of common information bits.

15. The method of claim 1, further comprising:
determining that a threshold quantity of communications associated with the IR-HARQ process have been transmitted based at least in part on transmitting the communication, or
receiving an acknowledgement (ACK) for the communication based at least in part on transmitting the communication; and
terminating the IR-HARQ process based at least in part on determining that the threshold quantity of communications have been transmitted or based at least in part on receiving the ACK.

16. A method of wireless communication performed by a wireless communication device, comprising:
receiving a communication, of an incremental redundancy (IR)-hybrid automatic repeat request (HARQ) process, that is encoded using an adjusted fractally enhanced kernel polar code;
identifying a block puncturing pattern or a block shortening pattern based at least in part on a code rate associated with the communication, wherein the code rate is based at least in part on a quantity of information bits associated with the communication or a quantity of transmitted bits associated with the communication;
determining a location of the information bits in the communication based at least in part on the block puncturing pattern or the block shortening pattern; and
decoding the communication based at least in part on determining the location of the information bits.

17. The method of claim 16, wherein identifying the block puncturing pattern or the block shortening pattern comprises:
identifying the block shortening pattern based at least in part on the code rate satisfying a threshold, or
identifying the block puncturing pattern based at least in part on the code rate not satisfying the threshold.

18. A wireless communication device, comprising:
a memory; and
one or more processors operatively coupled to the memory, the memory and the one or more processors configured to:
determine to block puncture or to block shorten a set of transmitted bits of an adjusted fractally enhanced kernel polar code for a communication of an incremental redundancy (IR)-hybrid automatic repeat request (HARQ) process based at least in part on a code rate associated with the communication of the IR-HARQ process,
wherein the code rate is based at least in part on a quantity of information bits associated with the communication or a quantity of transmitted bits associated with the communication;
generate the adjusted fractally enhanced kernel polar code for the communication based at least in part on determining to block puncture or to block shorten the set of transmitted bits; and
transmit the communication using the adjusted fractally enhanced kernel polar code.

19. The wireless communication device of claim 18, wherein determining to block puncture or to block shorten the set of transmitted bits comprises:
determine to block shorten the set of transmitted bits based at least in part on the code rate satisfying a threshold,
wherein the block shortening is performed on consecutive bits at a first end of the set of transmitted bits, or
determine to block puncture the set of transmitted bits based at least in part on the code rate not satisfying the threshold,
wherein the threshold is configured from an upper layer,
wherein the puncturing is performed on other consecutive bits at a second end of the set of transmitted bits.

20. The wireless communication device of claim 18, wherein generating the adjusted fractally enhanced kernel polar code comprises:
generate the adjusted fractally enhanced kernel polar code with a block length equal to a closest integer power of two greater than the quantity of transmitted bits associated with the communication based at least in part on determining to block puncture the set of transmitted bits; and puncture, to form a set of block punctured bits, a quantity of the set of transmitted bits for the communication equal to a difference between the block length of the adjusted fractally enhanced kernel polar code and the quantity of transmitted bits for the communication.

21. The wireless communication device of claim 20, wherein the one or more processors are further configured to:

determine a first quantity of a first subset of information bits for a first half block length of the block length and a second quantity of a second subset of information bits for a second half block length of the block length based at least in part on a mutual information allocation formula.

22. The wireless communication device of claim 21, wherein the one or more processors are further configured to:

generate the first subset of information bits for the first half block length and the second subset of information bits for the second half block length based at least in part on a pre-generated sequence; and select a set of most reliable bits from the first subset of information bits and the second subset of information bits based at least in part on the pre-generated sequence.

23. The wireless communication device of claim 18, wherein the communication includes a set of block punctured bits, and wherein the one or more processors are further configured to:

receive a negative acknowledgement (NACK) for the communication after transmitting the communication;

generate the fractally enhanced kernel polar code for a subsequent communication with a block length equal to a closest integer power of two greater than or equal to a total quantity of transmitted bits for communications associated with the IR-HARQ process based at least in part on receiving the NACK; and puncture, to form another set of block punctured bits, a quantity of the set of transmitted bits, for the subsequent communication, equal to a difference between the closest integer power of two for the subsequent communication and the total quantity of transmitted bits for the communications associated with the IR-HARQ process.

24. The wireless communication device of claim 23, wherein the one or more processors are further configured to:

select a set of most reliable bits from a set of information bits for the subsequent communication by excluding a set of frozen bits associated with a previous communication, after puncturing the quantity of the set of transmitted bits, for the subsequent communication, to form the other set of block punctured bits.

25. The wireless communication device of claim 18, wherein generating the adjusted fractally enhanced kernel polar code comprises:

generate the adjusted fractally enhanced kernel polar code with a block length equal to a closest integer power of two greater than or equal to the quantity of transmitted bits associated with the communication based at least in part on determining to block shorten the set of transmitted bits; and shorten, to form a set of block shortened bits, a quantity of the set of transmitted bits for the communication equal to a difference between the block length of the adjusted fractally enhanced kernel polar code and the quantity of transmitted bits for the communication.

26. The wireless communication device of claim 25, wherein the one or more processors are further configured to:

determine a first subset of information bits for a first half block length of the block length and a second subset of information bits for a second half block length of the block length based at least in part on a mutual information allocation formula, and an adjusted quantity of information bits, wherein information bits of the adjusted quantity of information bits with a lowest reliability are removed from a selected information bit set.

27. The wireless communication device of claim 18, wherein the communication includes a set of block shortened bits, and wherein the one or more processors are further configured to:

receive a negative acknowledgement (NACK) for the communication after transmitting the communication;

generate the fractally enhanced kernel polar code for a subsequent communication with a block length equal to a closest integer power of two greater than or equal to a quantity of transmitted bits for the subsequent communication based at least in part on receiving the NACK; and puncture, to form a set of block punctured bits, a quantity of the set of transmitted bits, for the subsequent communication, equal to a difference between the block length of the adjusted fractally enhanced kernel polar code and the quantity of transmitted bits for the subsequent communication.

28. The wireless communication device of claim 27, wherein the one or more processors are further configured to:

select a set of most reliable bits from a set of information bits for the subsequent communication and another set of information bits for a previous communication excluding a set of frozen bits associated with the previous communication based at least in part on puncturing the quantity of the set of transmitted bits, for the subsequent communication, to form the set of block punctured bits.

29. A wireless communication device, comprising:
a memory; and
one or more processors operatively coupled to the memory, the memory and the one or more processors configured to:

receive a communication, of an incremental redundancy (IR)-hybrid automatic repeat request (HARQ) process, that is encoded using an adjusted fractally enhanced kernel polar code;

identify a block puncturing pattern or a block shortening pattern based at least in part on a code rate associated with the communication, wherein the code rate is based at least in part on a quantity of information bits associated with the communication or a quantity of transmitted bits associated with the communication;

determine a location of the information bits in the communication based at least in part on the block puncturing pattern or the block shortening pattern; and decode the communication based at least in part on determining the location of the information bits.

30. The wireless communication device of claim 29, wherein identifying the block puncturing pattern or the block shortening pattern comprises:

identify the block shortening pattern based at least in part on the code rate satisfying a threshold, or identify the block puncturing pattern based at least in part on the code rate not satisfying the threshold.

* * * * *